United States Patent [19]
Iwasaki et al.

[11] Patent Number: 5,986,204
[45] Date of Patent: Nov. 16, 1999

[54] PHOTOVOLTAIC CELL

[75] Inventors: Yukiko Iwasaki; Katsumi Nakagawa; Kozo Arao, all of Nara, Japan

[73] Assignee: Canon Kabushiki Kaisha, Tokyo, Japan

[21] Appl. No.: 08/820,565

[22] Filed: Mar. 19, 1997

[30] Foreign Application Priority Data

Mar. 21, 1996 [JP] Japan ................................. 8-064854
Apr. 8, 1996 [JP] Japan ................................. 8-085600

[51] Int. Cl.$^6$ ................................................. H01L 31/00
[52] U.S. Cl. ................................ 136/256; 438/71; 438/72
[58] Field of Search ............................ 136/256; 438/71, 438/72

[56] References Cited

U.S. PATENT DOCUMENTS

| | | | |
|---|---|---|---|
| 4,419,533 | 12/1983 | Czubatyj et al. | 136/259 |
| 4,492,181 | 1/1985 | Ovshinsky et al. | 118/718 |
| 4,941,032 | 7/1990 | Kobayashi et al. | 136/256 |
| 5,486,238 | 1/1996 | Nakagawa et al. | 136/259 |

FOREIGN PATENT DOCUMENTS 3-166770  7/1991  Japan ................ H01L 31/04

*Primary Examiner*—Mark Chapman
*Attorney, Agent, or Firm*—Fitzpatrick, Cella, Harper & Scinto

[57] ABSTRACT

By using an improved back reflecting layer, a photovoltaic cell having excellent migration resistance and a high photoelectric conversion efficiency is provided at high productivity. The photovoltaic cell includes a metal layer comprising a silver-aluminum alloy having a content of silver equal to or less than 30 atomic percent, the rest being aluminum, or a metal layer comprising a copper-aluminum alloy having a content of copper between 30 and 50 atomic percent, the rest being aluminum. It is preferable to form these layers at a relatively low temperature by sputtering, particularly at a temperature equal to or less than 110° C. for the silver-aluminum alloy and at a temperature equal to or less than 120° C. for the copper-aluminum alloy.

6 Claims, 14 Drawing Sheets

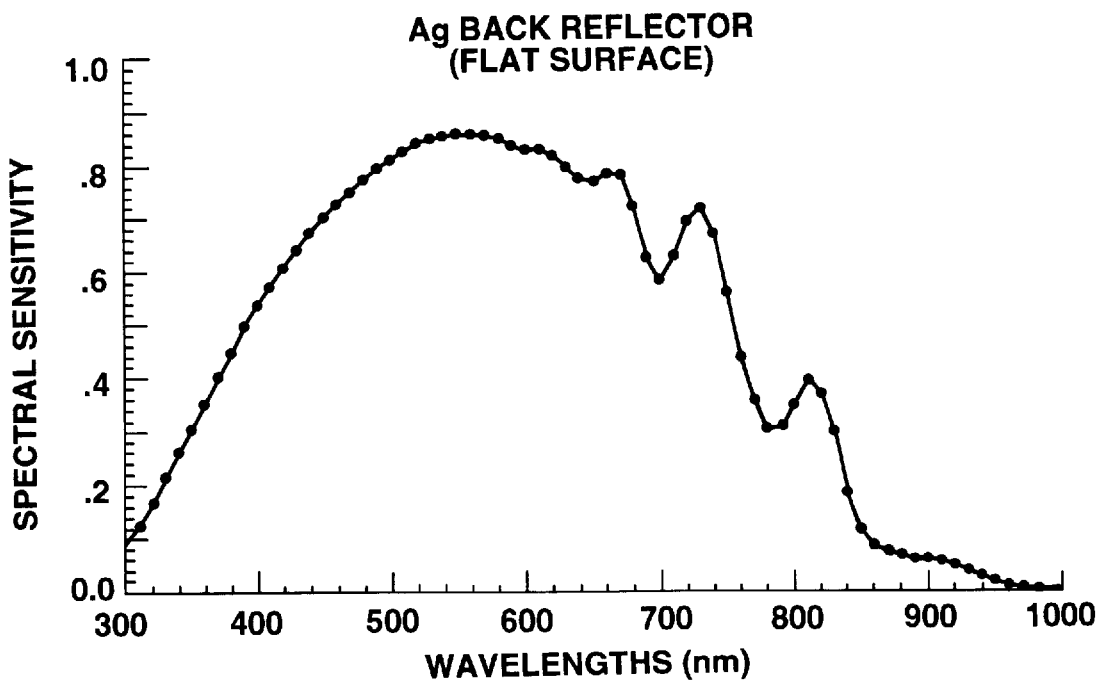
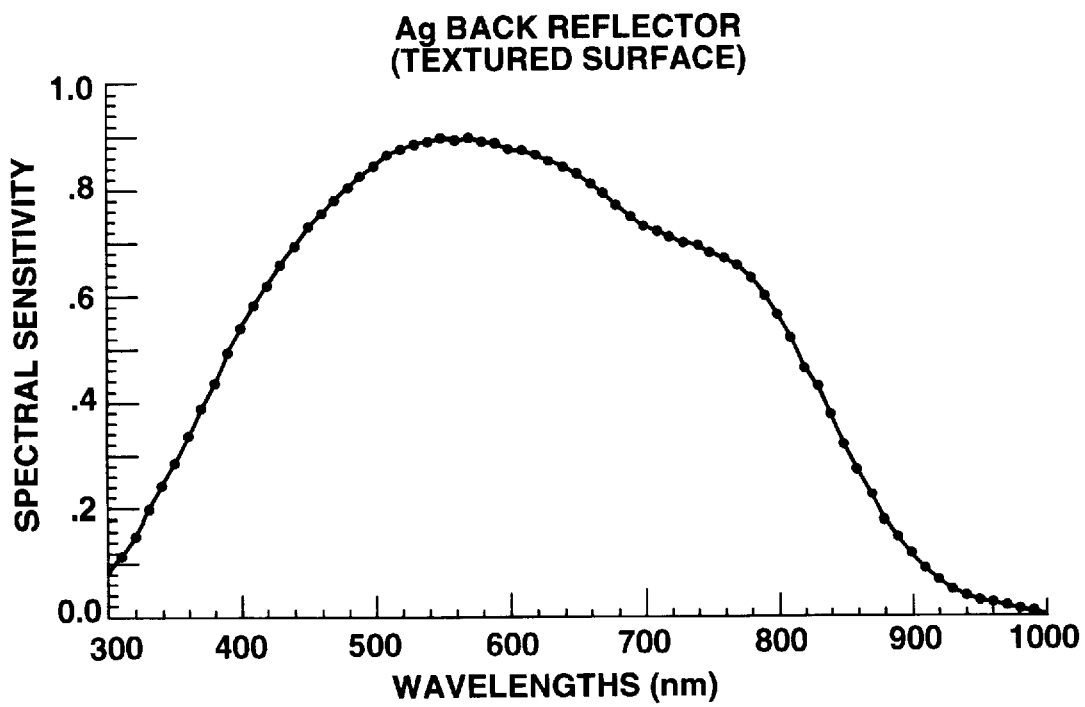

PHOTOVOLTAIC CELL

BACKGROUND OF THE INVENTION

1. Field of the Invention

This invention relates to a photovoltaic cell. More particularly, the invention relates to a high-performance photovoltaic cell which can be reliably used for a long time and which can be subjected to mass production at a low cost.

2. Description of the Related Art p U.S. Pat. No. 4,419,533 discloses a photovoltaic cell in which the surface of a metal layer has a textured structure and in which a back reflecting layer having a transparent layer formed thereon is provided. According to such a configuration, solar light which has not been absorbed by semiconductor layers, comprising thin-film semiconductors, is returned to the semiconductor layers to effectively utilize the incident light. According to the textured structure of the surface of the metal layer and/or the transparent layer, the length of the optical path of reflected light is lengthened, thereby contributing to an increase in the short-circuit current density.

FIGS. 3(a) and 3(b) are graphs illustrating a state in which the absorption of incident light increases as a result of adoption of a back reflecting layer having a textured structure. FIG. 3(a) illustrates the spectral sensitivity of an a(amorphous)-SiGe solar cell in which a specular silver layer is used as a metal layer serving as a back reflecting layer. FIG. 3(b) illustrates the spectral sensitivity when a textured structure silver layer is used instead of the specular silver layer shown in FIG. 3(a). In the solar cell shown in FIG. 3(a), light in the wavelength regions of 700 nm, 780 nm and 850 nm is not effectively utilized in the semiconductor layers comprising an a-SiGe semiconductor. On the other hand, in the solar cell shown in FIG. 3(b), a drop in the spectral sensitivity (Q-value) is hardly observed in these wavelength regions. Accordingly, it can be understood that the use of a back reflecting layer having a high reflectivity for light of these wavelength regions is effective for increasing the conversion efficiency.

FIG. 2 illustrates the results of studies on the reflectivity for Ag, Al, Cu and Ni monolayer films having a thickness of 200 nm. It can be understood from FIG. 2 that while silver and copper show high reflectivity values at the entire wavelength region of 700–1,000 nm required for thin-film semiconductors used in the present invention, aluminum has a minimum value in the vicinity of the wavelength of 800 nm, and nickel has low reflectivity values in the entire wavelength region. Accordingly, silver and copper are suitable as a material for forming a metal layer serving as a back reflecting layer.

Although the use of silver or copper having a superior reflectivity value as a metal for the back reflecting layer is very advantageous for obtaining a solar cell having a high conversion efficiency, these metals, particularly, silver, are known as metals causing electrochemical migration.

Electrochemical migration (hereinafter abbreviated as "migration") is a phenomenon in which, when a metal in the form of a foil, a plated substance, a paste or the like, is used in high humidity while contacting a hygroscopic or hydrophilic insulator in a state in which a DC voltage is applied, the metal grows in the form of a dendrite or penetrates the surface or the inside of the insulator due to electrolysis to form a conductive path. There have been reported that for some metals, conditions other than the ones described above are required. For example, migration occurs in the presence of distilled water and an electric field for silver (Ag), copper (Cu), lead (Pb) and the like (the growth rate of dendrite crystals of Ag is particularly high). For gold (Au), palladium (Pd), indium (In) and the like, migration occurs when halogen ions are present. On the other hand, migration does not occur under the above-described conditions for aluminum (Al), nickel (Ni), iron (Fe) and the like.

In solar cells which will be used in various environments, short circuiting between electrodes due to the above-described migration is a problem during the use of a long time period. For example, consider a case in which solar cells practically used outdoors are in an environment of high temperature and high humidity. In general, since the output voltage of a single solar cell is low, a plurality of submodules (each comprising the above-described thin-film-semiconductor solar cells assembled in the form of a module) are used by being connected in series. When such solar cells are partly covered with fallen leaves or the like, the output currents of the submodules of the covered portion become much smaller than those of other submodules, thereby substantially increasing the internal impedance. As a result, the output voltages of the other submodules are applied in a reverse direction. That is, the conditions for generating migration of high temperature, high humidity and the application of an inverse bias are realized, thereby causing short circuit between electrodes and damage of the submodules. This a technical problem particularly to be solved when using Ag or Cu having a high reflectivity suitable for the back reflecting layer.

In order to solve such a problem, a metal having better migration resistance, i.e., Al, Ni or the like, may be used instead of Ag or Cu. However, when using Al, Ni or the like, although the migration problem is lessened, the photoelectric conversion efficiency decreases because the reflectivity of such a metal is lower than that of Ag or Cu. Particularly, a portion where the reflectivity drops in the vicinity of the wavelength of 800 nm is present for Al.

Japanese Patent Laid-Open Application (Kokai) No. 3-166770 (1991) describes the provision of a diffusion prevention layer comprising copper oxide in order to prevent diffusion of copper used for the back reflecting layer into the semiconductor layers. This approach, however, requires an additional process of oxidizing the surface of copper.

SUMMARY OF THE INVENTION

It is an object of the present invention to provide a photovoltaic cell, which has excellent migration resistance property and a high photoelectric conversion efficiency by using an improved back reflecting layer, with high productivity.

According to one aspect, the present invention which achieves the above-described object relates to a photovoltaic cell comprising a metal layer comprising a silver-aluminum alloy having a content of silver equal to or less than 30 atomic percent, the rest being aluminum, a photovoltaic conversion layer, and a substrate.

According to another aspect, the present invention which achieves the above-described object relates to a method for manufacturing a photovoltaic cell, comprising the steps of forming a metal layer comprising a silver-aluminum alloy having a content of silver equal to or less than 30 atomic percent, the rest being aluminum, by sputtering at a temperature equal to or less than 110° C., and forming a photovoltaic conversion layer.

According to still another aspect, the present invention which achieves the above-described object relates to a photovoltaic cell comprising a metal layer comprising a copper-aluminum alloy having a content of copper between 30 and 50 atomic percent, the rest being aluminum, a photovoltaic conversion layer, and a substrate.

According to yet another aspect, the present invention which achieves the above-described object relates to a method for manufacturing a photovoltaic cell, comprising the steps of forming a metal layer comprising a copper-aluminum alloy having a content of copper between 30 and 50 atomic percent, the rest being aluminum, by sputtering at a temperature equal to or less than 120° C., and forming a photovoltaic conversion layer.

It is preferable to form the above-described metal layers at a relatively low temperature by sputtering, particularly at a temperature equal to or less than 110° C. for the silver-aluminum alloy and at a temperature equal to or less than 120° C. for the copper-aluminum alloy.

The foregoing and other objects, advantages and features of the present invention will become more apparent from the following detailed description of the preferred embodiments taken in conjunction with the accompanying drawings.

BRIEF DESCRIPTION OF THE DRAWINGS

FIGS. 3(a) and 3(b) are graphs, each illustrating the result of an increase in the absorption of incident light when using a back reflecting layer having a textured structure in the present invention;

DETAILED DESCRIPTION OF THE PREFERRED EMBODIMENTS

Figure 1:
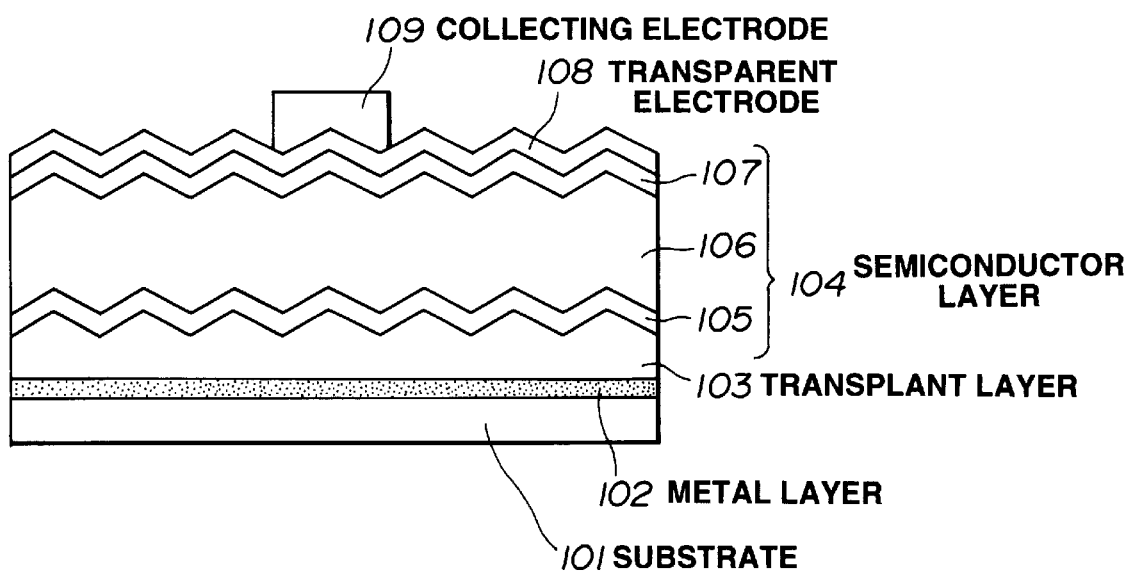
FIG. 1 is a schematic cross-sectional view illustrating the configuration of a photovoltaic cell according to the present invention.

FIG. 1 is a schematic cross-sectional view illustrating the configuration of an improved photovoltaic cell having a back reflecting layer according to the present invention. In FIG. 1, a metal layer 102, a transparent layer 103, a semiconductor layer 104, a transparent electrode 108 and a collecting electrode 109 are laminated on a substrate 101.
Metal layer The metal layer 102 of the present invention comprises a silver-aluminum alloy in which the content of silver is equal to or less than 30 atomic percent or a copper-aluminum alloy in which the content of copper is between 30 and 50 atomic percent.

According to the present invention, since the back reflecting layer having a high reflectivity and improved migration resistance can be formed, a very reliable photovoltaic cell having a high photoelectric conversion efficiency is obtained. Furthermore, since copper and aluminum serving as materials for the back reflecting layer are inexpensive, a low-cost photovoltaic cell which can be subjected to mass production is obtained.

Figure 4:
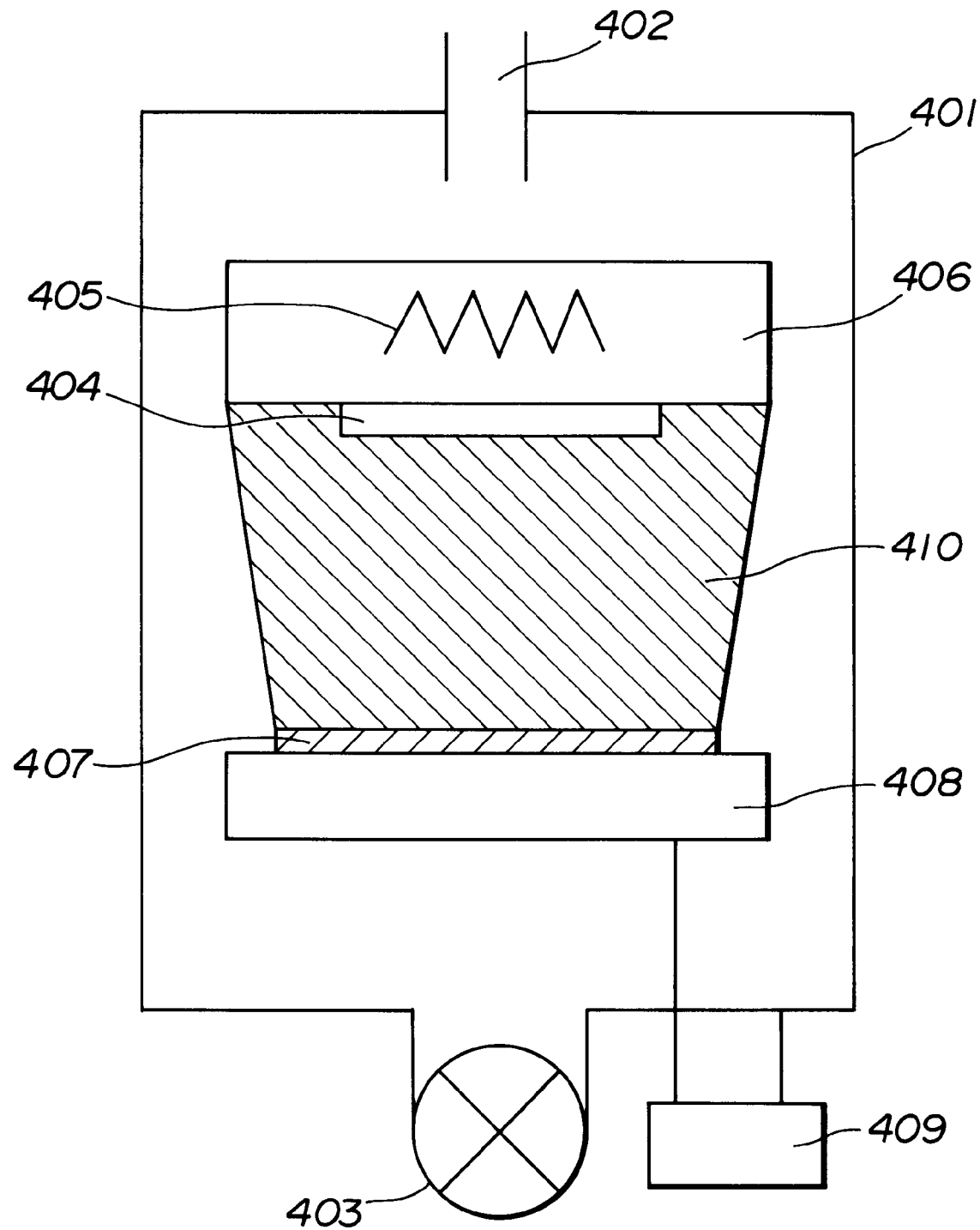
FIG. 4 is a schematic diagram illustrating the configuration of a DC magnetron sputtering apparatus used when forming a metal layer in the present invention.

These conclusions have been obtained as the results of the following experiments.
Experimental apparatus In all of the experiments, a DC magnetron sputtering apparatus shown in FIG. 4 was used for depositing the metal layer. In FIG. 4, the inside of a deposition chamber 401 can be evacuated by a vacuum pump (not shown). An inert gas, such as argon (Ar) or the like, of a predetermined flow rate is introduced into the deposition chamber 401 from a gas introducing tube 402 connected to a gas bomb (not shown). By adjusting the aperture of an exhaust valve 403, the inside of the deposition chamber 401 is set to a predetermined pressure. A substrate 404 is fixed on the surface of an anode 406 having a heater 405 provided therein. A cathode electrode 408 having a target 407 fixed on the surface thereof is provided so as to face the anode 406. Usually, a metal block to be deposited having a purity of about 99.9–99.999% is used as the target 407. The cathode electrode 408 is connected to a DC power supply 409, which applies a DC high voltage to generate a plasma 410 between the anode 406 and the cathode electrode 408. Metal atoms of the target 407 are deposited on the substrate 404 by the function of the plasma. By using a magnetron sputtering apparatus in which the intensity of the plasma is increased by providing a magnet within the cathode 408, the deposition rate can be increased.
Experiment 1/the relationship between the content of silver and the reflectivity In this experiment, the DC magnetron sputtering apparatus shown in FIG. 4 was used, and each metal layer was formed by changing the content of Ag in an Al—Ag alloy film. The contents of Ag were 87, 76, 64, 46, 39, 25, 16, 10 and 7 (atomic percent).

(1) Al—Ag alloy films 200 nm thick having the contents of Ag of 87, 76, 64, 46, 39, 25, 16 and 7 atomic percents were deposited on respective stainless steel plates (SUS304) having a size of 5 cm×5 cm subjected to mirror polishing.

The obtained samples are represented by 1a, 1b, 1c, 1d, 1e, 1f, 1h and 1i, respectively.

(2) For the purpose of comparison, films made of pure Ag and pure Al were formed in the same manner. The obtained samples are represented by 1j and 1k, respectively. Since these samples were deposited at a deposition rate of 4 nm/sec at room temperature, the surfaces of the samples were specular.

Targets made of Ag and Al having a purity of 99.999% were used for preparing the samples 1j and 1k. For preparing the alloy samples 1a–1c, an Al wire having a purity of 99.999% processed in the form of a ring was disposed on an Ag target. The samples 1d–1i were prepared by disposing Ag shots having a purity of 99.99% and a diameter of 2–3 mm on an Al target so as to provide a desired composition. All samples except samples 1j and 1k were analyzed by an X-Ray energy-dispersion-type analyzing apparatus (XMA (X-Ray microanalyzer)) to confirm the composition.

Figure 2:
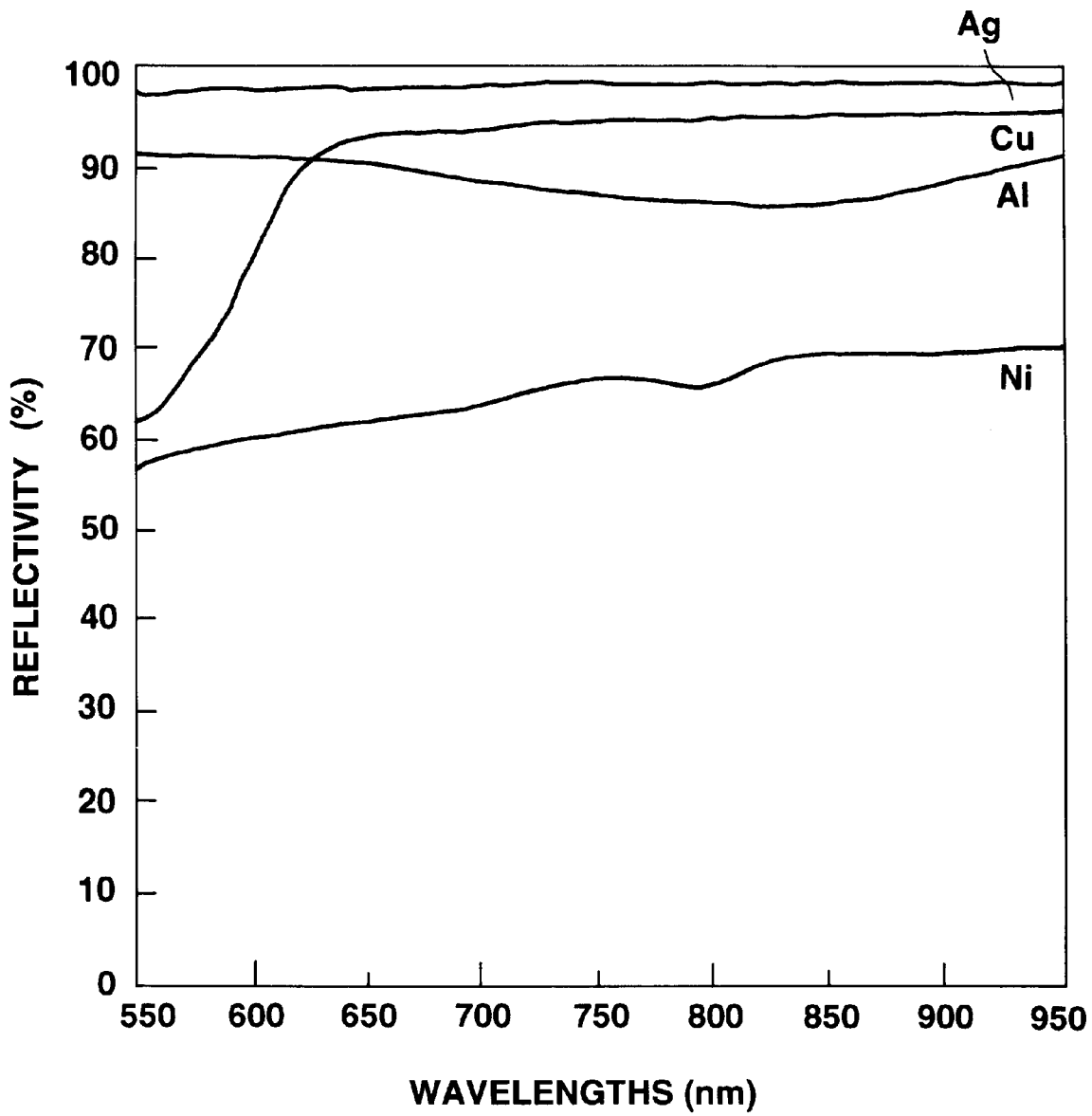
FIG. 2 is a graph illustrating the values of reflectivity of Ag, Al, Cu and Ni films, each studied as a metal layer used in the present invention.

(3) For each of the above-described 10 samples, the reflectivity for light having a wavelength range of 400–1,200 nm was measured. From the result shown in FIG. 2, it is known that the reflectivity of Al has a minimum value in the vicinity of 800 nm. Accordingly, FIG. 5 illustrates values observed at 800 nm as the representative values of reflectivity obtained for respective compositions.

Figure 5:
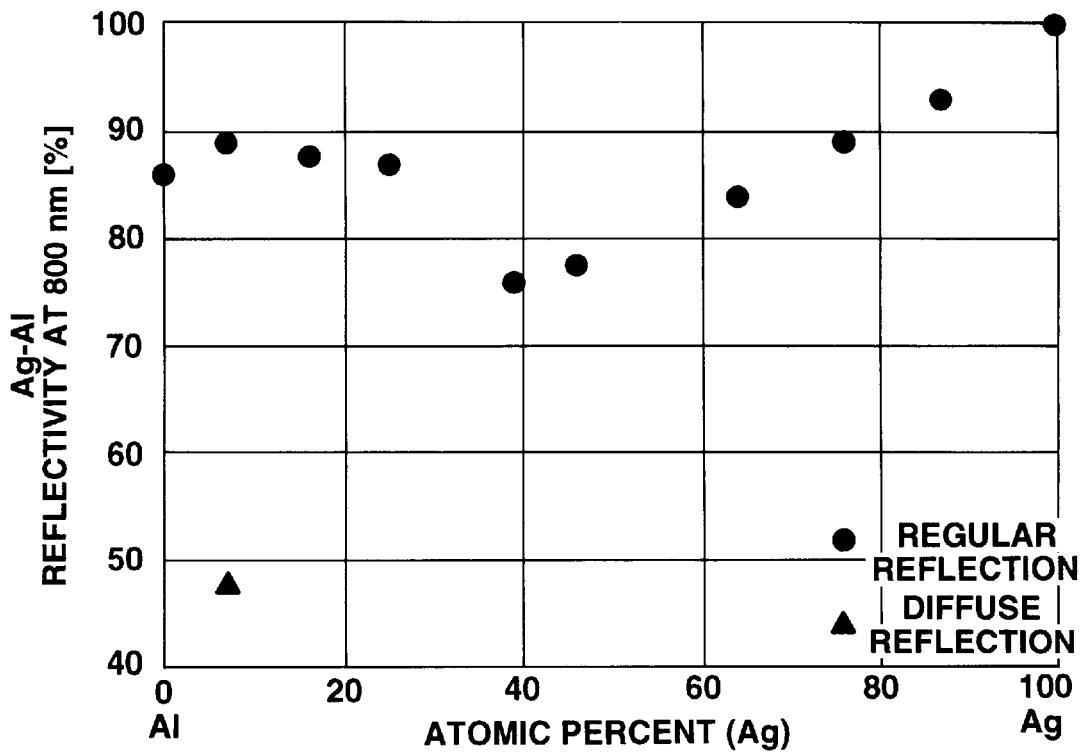
FIG. 5 is a graph illustrating the relationship between the content of Ag in an Al—Ag alloy film and the reflectivity of each sample at a wavelength of 800 nm in the present invention.

FIG. 5 indicates that the reflectivity decreases as the content of Ag decreases until a composition in the vicinity of 50 atomic percent of Ag, then starts to increase from a composition lower than 39 atomic percent, and has a maximum value in the vicinity of 7 atomic percent. By performing interpolation in FIG. 5, it seems that the reflectivity is at least 86%, which is equivalent to the value for Al, at an atomic percent of Ag equal to or less than 30 atomic percent. Even in an Al-rich film where the content of Ag is less than 30 atomic percent, the drop in the reflectivity at the wavelength of 800 nm is not observed, and high reflectivity values are obtained over the entire wavelength range.

Experiment 2/the relationship between the temperature for forming an Ag—Al layer and the reflectivity This experiment differs from the sample 1i in Experiment 1 in that metal layers comprising an Al—Ag alloy were formed by changing the substrate temperature as 100, 120, 140, 160, 200, 300 and 400° C., and the obtained samples are represented 2a, 2b, 2c, 2d, 2e, 2f and 2g, respectively. The content of Ag, the deposition rate and the thickness of the film were fixed to 7 atomic percent where a high reflectivity was obtained in Experiment 1, 0.6 nm/sec and 900 nm, respectively.

Figure 6:
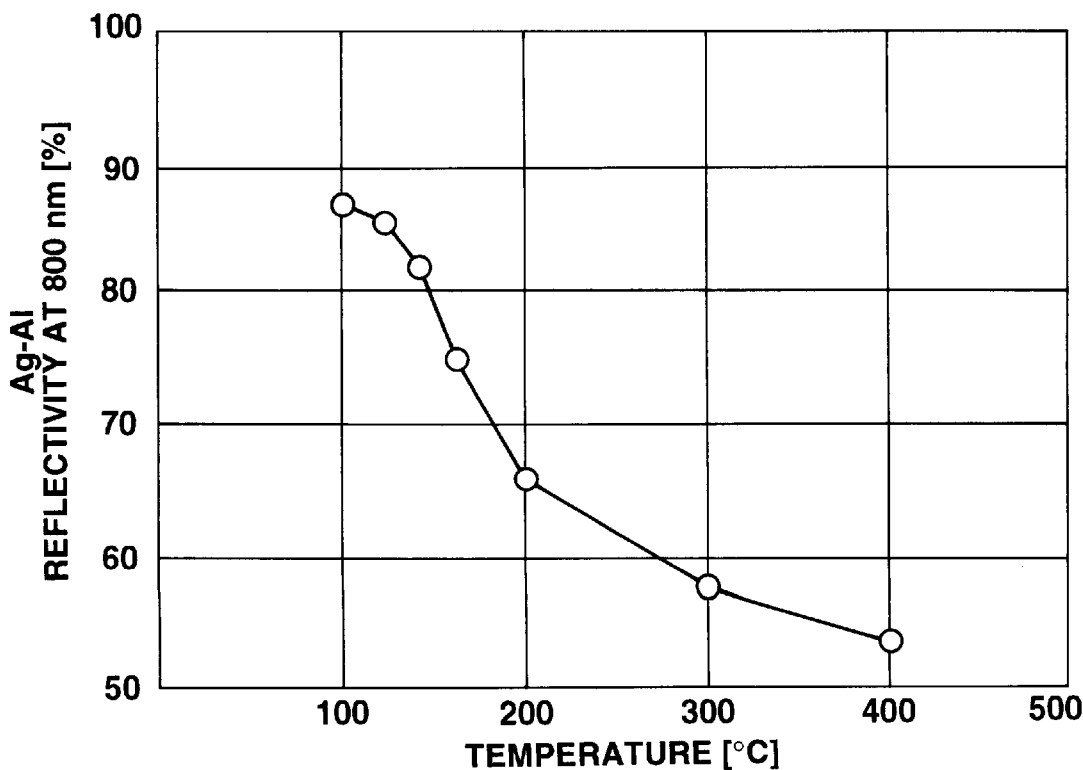
FIG. 6 is a graph illustrating the relationship between the substrate temperature when forming an Al—Ag film and the reflectivity of the obtained film in the present invention.

The same measurements as in Experiment 1 were performed for these samples, and results shown in FIG. 6 were obtained. It can be understood from FIG. 6 that the reflectivity decreases as the substrate temperature increases. The results of analysis of the surfaces of the respective films using a SEM (scanning electron microscope) and a XMA indicate that the texture develops to a greater extent for a sample formed at a higher temperature and has the shape which resembles that of pure Al. Ag segregates at the distal ends of projections of the texture. Since an Al phase appears at a high-temperature region where the content of Ag is equal to or less than 24 atomic percent in a binary alloy phase diagram indicating the relationship between the alloy composition and the temperature, it seems that Al or Ag segregates because of film formation at a high temperature. By performing interpolation in FIG. 6, it can be considered that a uniform film not having segregation is obtained if an Al—Ag alloy film is formed at a temperature equal to or less than 110 ° C.

As described above, by providing a metal layer having a textured structure, light incident upon a photovoltaic cell can be effectively utilized. In general, in order to deposit a metal layer having a textured structure, a film may be formed at a low deposition rate at a high temperature. However, in the metal layer of the present invention, segregation occurs if a film is formed at a high temperature, thereby reducing the reflectivity. Accordingly, in order to provide the metal layer of the present invention with a textured structure, it is necessary to provide a textured structure before depositing the metal layer, and to form the film on that structure at a temperature equal to or less than 110° C. The textured structure may be formed on the surface of the sustrate 101, or another textured metal layer may be formed in advance.

Experiment 3/the relationship between the content of silver and the time period until short circuit occurs This experiment differs from Experiment 1 in that a comb-shaped electrode mask having a spacing of 200 μm was placed on a non-alkali (#7059) substrate having a size of 5 cm square, and a metal layer comprising an Al—Ag alloy was formed on the substrate.

The values of content of Ag of the prepared samples were 87, 76, 64, 46, 39, 25, 16, 10 and 7 (atomic percent), and the samples are indicated by 3a, 3b, 3c, 3d, 3e, 3f, 3g, 3h and 3i, respectively. For the purpose of comparison, samples 3j and 3k made of pure Ag and pure Al, respectively, were prepared.

Figure 7:
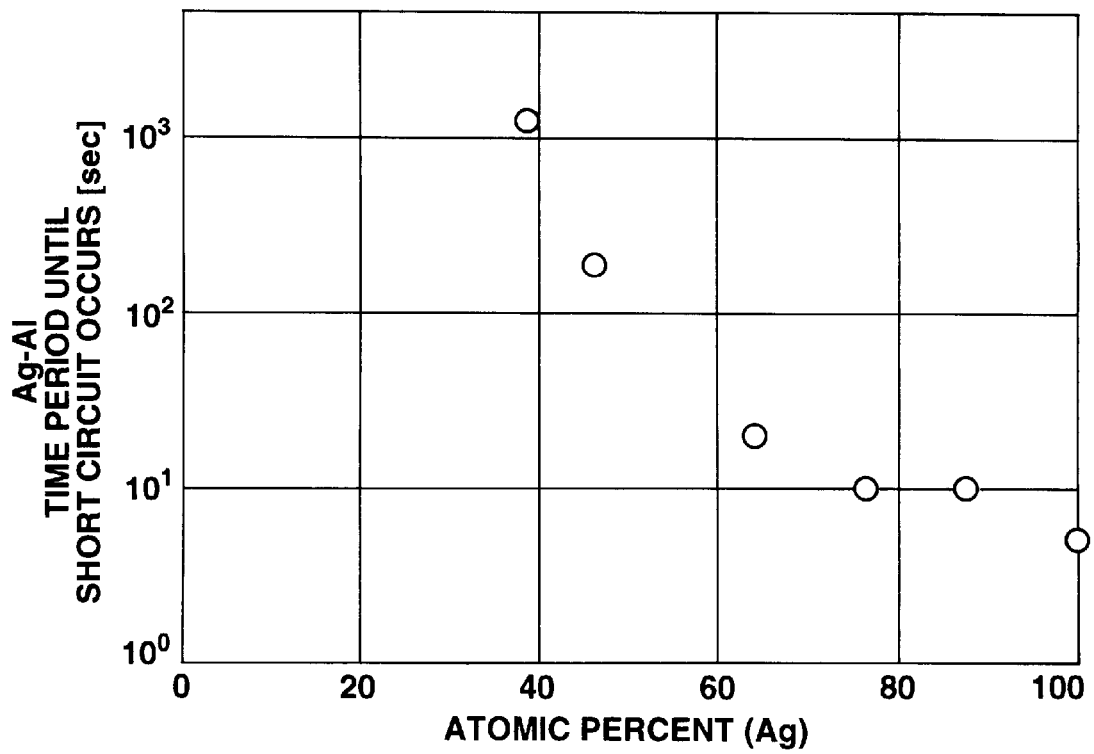
FIG. 7 is a graph illustrating the relationship between the time period until short circuit between electrodes occurs due to the growth of dendrite crytals in each sample and the content of Ag in an Al—Ag alloy in the present invention.

A pure-water droplet was placed on the electrodes having the spacing of 200 μm for each of these 11 samples, a voltage of 10 V was applied between the electrodes, and the growth of dendrite crystals was observed under a microscope. FIG. 7 is a graph in which the ordinate represents the time period until the electrodes were short-circuited due to the growth of dendrite crystals, and the abscissa represents the content of Ag in the Al—Ag alloy. It has become clear from FIG. 7 that the time period until the electrodes were short-circuited increases as the amount of addition of Ag decreases, and that the frequency of the generation of dendrite cystals can be suppressed. Particularly, when the content of Ag is less than 30 atomic percent, the generation of dendrite crystals is not observed.

Experiment 4/the relationship between the content of silver and the generated current In this experiment, after forming a ZnO transparent layer on a metal layer comprising an Al—Ag alloy, a semiconductor layer comprising a nip junction of a thin-film semiconductor, a transparent electrode and a collecting electrode were laminated in this sequence.

Manufacturing procedures will now be described.

(1) The metal layer comprises an Al—Ag alloy having a content of Ag of 10 atomic percent and a thickness of 200 nm, and was formed in the same manner as in Experiment 1.

(2) A ZnO film 1,000 nm thick, serving as the transparent layer, was deposited on the metal layer.

(3) An n-type a-Si layer 20 nm thick, an i-type a-Si layer 400 nm thick, and a p-type microcrystalline (μc) Si layer 10 nm thick were sequentially deposited on the transparent layer by a glow discharge decomposition method using $SiH_4$ and $PH_3$, $SiH_4$, and $SiH_4$, $BF_3$ and $H_2$ as source gases, respectively, to provide the semiconductor layer.

(4) An indium-tin oxide (ITO) film 65 nm thick was deposited on the semiconductor layer by a resistance heating vacuum deposition method to provide the transparent electrode.

(5) The collecting electrode having a width of 300 μm was formed on the transparent electrode using an Ag paste to provide a solar cell.

The sample obtained according to the above-described processes (1)–(5) is represented by 4a.

For the purpose of comparison, samples whose metal layers comprise pure Ag and pure Al were prepared and are represented by 4b and 4c, respectively.

The values of photocurrent Jsc were measured for these samples under an AM (air mass)-1.5 solar simulator. While the measured values are 17.7 mA/cm$^2$, 16.5 mA/cm$^2$ for the samples 4b and 4c, respectively, the measured value for the sample 4a is 17.5 mA/cm$^2$, which is close to the value for the sample 4b in which the metal layer was formed by pure Ag.

Experiment 5/the relationship between the content of silver and the change in time of the shunt resistance In this experiment, a reverse voltage of 0.85 V was applied to samples 4a, 4b and 4c obtained in Experiment 4 in an atmosphere of 85% relative humidity and 85° C. (a high-humidity reverse-bias test) in a dark state, and changes in time of the value of RshDk (Rsh in a dark state) were measured and the measured values were compared with one another.

Figure 8:
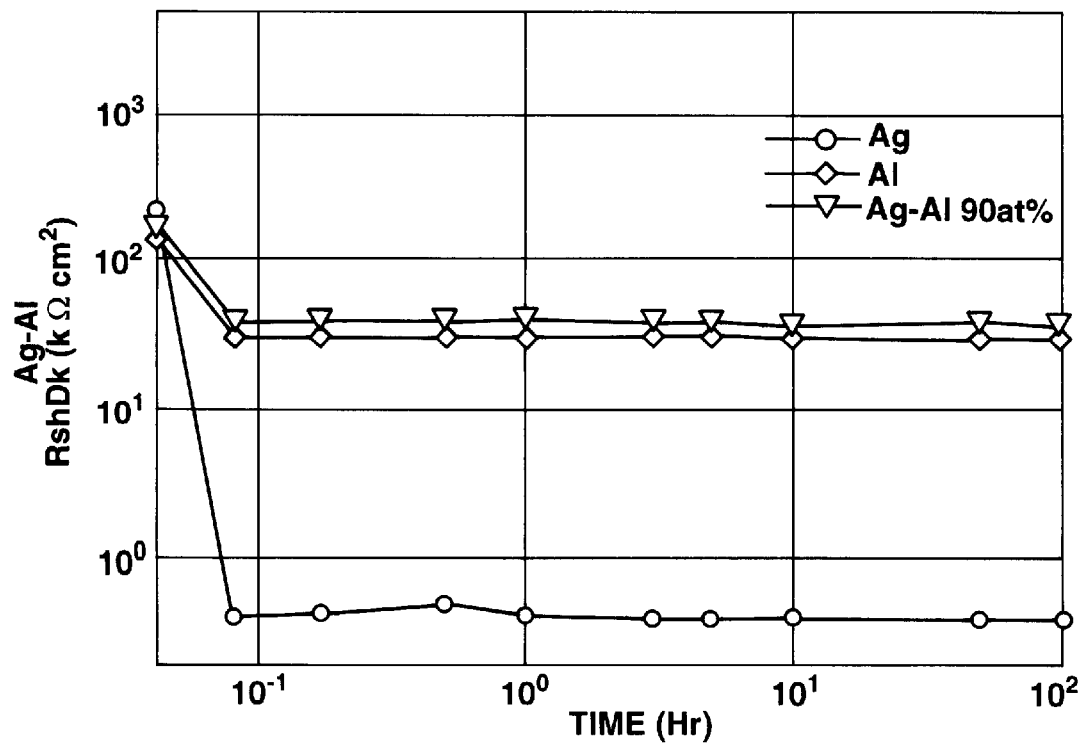
FIG. 8 is a graph illustrating the relationship between the value of RshDk of each Al—Ag film and the elasped time period in the present invention.

FIG. 8 illustrates the results of changes in time of the values of RshDk for the respective samples. The results of the preceding experiments indicate that, when the value of RshDk becomes less than 10 kΩ cm$^2$, no open voltage appears under the light of a low illuminance, thereby causing problems in the characteristics and reliability of the solar cell. Accordingly, a condition of RshDk $\geq$10 kΩ cm$^2$ is set as the acceptability criterion of the high-humidity reverse-bias test.

It has become clear from FIG. 8 that the value of RshDk of the sample 4b rapidly decreases as soon as the measurement starts to become less than 10 kΩ cm$^2$. The value of RshDk of the sample 4c does not become less than 31 kΩ cm$^2$. The sample 4a also does not show a decrease in the value of RshDk as the sample 4c.

From the above-described results of the experiments, it can be understood that an Al—Ag alloy suitable for the reflecting layer preferably has a content of Ag equal to or less than 30 atomic percent and is formed at a substrate temperature equal to or less than 110° C.

Experiment 6/the relationship between the content of copper and the reflectivity In this experiment, using the DC magnetron sputtering apparatus shown in FIG. 4, metal layers were formed by changing the concentration of Al in Cu—Al alloy films. The concentration of Al was changed as 15, 30, 45, 53, 62 and 85 (atomic percent).

A description will now be provided in the sequence of experimental procedures.

(1) Cu—Al alloy films 100 nm thick having the concentrations of Al of 15, 30, 45, 53, 62 and 85 atomic percents were deposited on respective stainless steel plates (SUS304) having a size of 5 cm×5 cm subjected to mirror polishing. The obtained samples are represented by 6a, 6b, 6c, 6d, 6e and 6f, respectively.

(2) For the purpose of comparison, films made of pure copper and pure aluminum were formed in the same manner. The obtained samples are represented by 6g and 6h, respectively. Since these samples were deposited at a deposition rate of 4 nm/sec at the room temperature, the surfaces of the samples were specular.

Targets made of copper and Al having a purity of 99.999 % were used for preparing the samples 6g and 6h, respectively. For preparing the alloy sample 6a, an Al wire having a purity of 99.999% processed in the form of a ring was disposed on a Cu target. The samples 6b–6f were prepared by disposing copper plates having a purity of 99.99% and a diameter of 7 mm on an Al target so as to provide a desired composition. All samples except samples 6g and 6h were analyzed by the X-Ray energy-dispersion-type analyzing apparatus (XMA) to confirm the composition.

(3) For each of the above-described 8 samples, the reflectivity for light having a wavelength range of 400–1,200 nm was measured. From the results shown in FIG. 2, it is known that the reflectivity of Al has a minimum value in the vicinity of 800 nm. Accordingly, FIG. 12 illustrates values observed at 800 nm as the representative values of reflectivity obtained for respective compositions.

Figure 12:
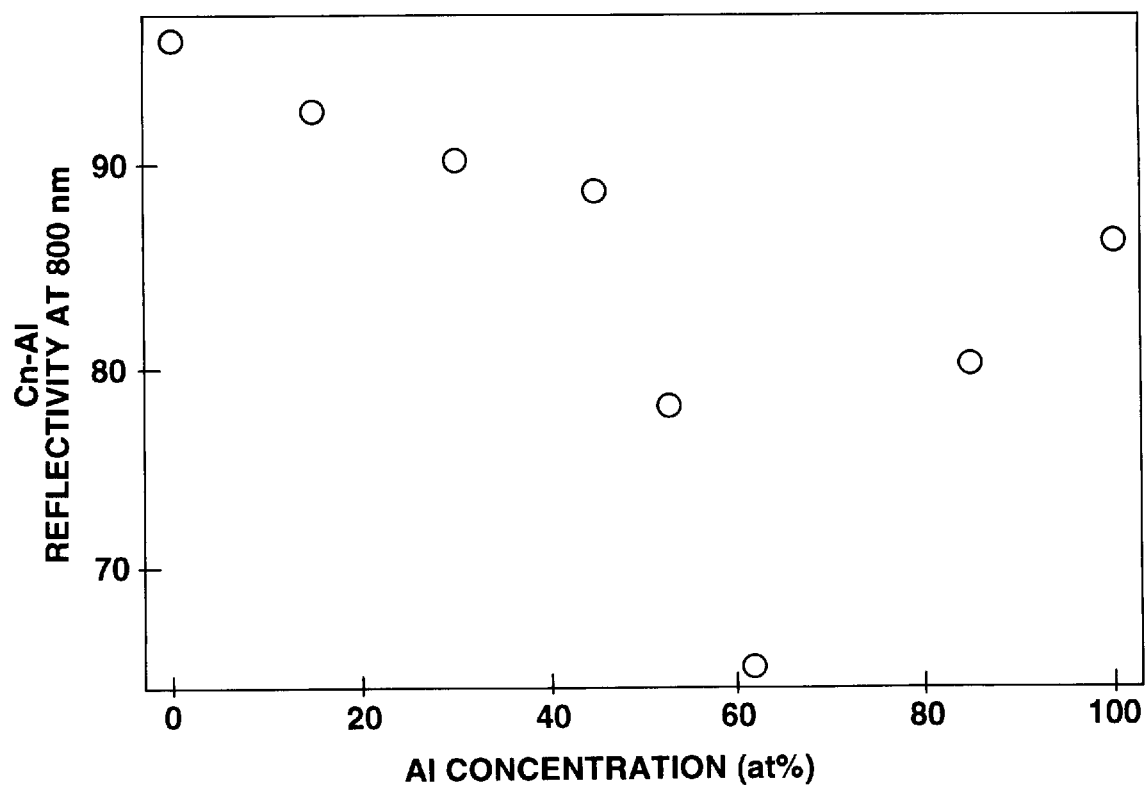
FIG. 12 is a graph illustrating the relationship between the content of Cu in an Al—Cu alloy film and the reflectivity of each sample at a wavelength of 800 nm in the present invention.

FIG. 12 indicates that the reflectivity gradually decreases as the concentration of Al increases, then rapidly decreases in the vicinity of 50 atomic percent, and has a minimum value in the vicinity of 60 atomic percent.

Figure 13:
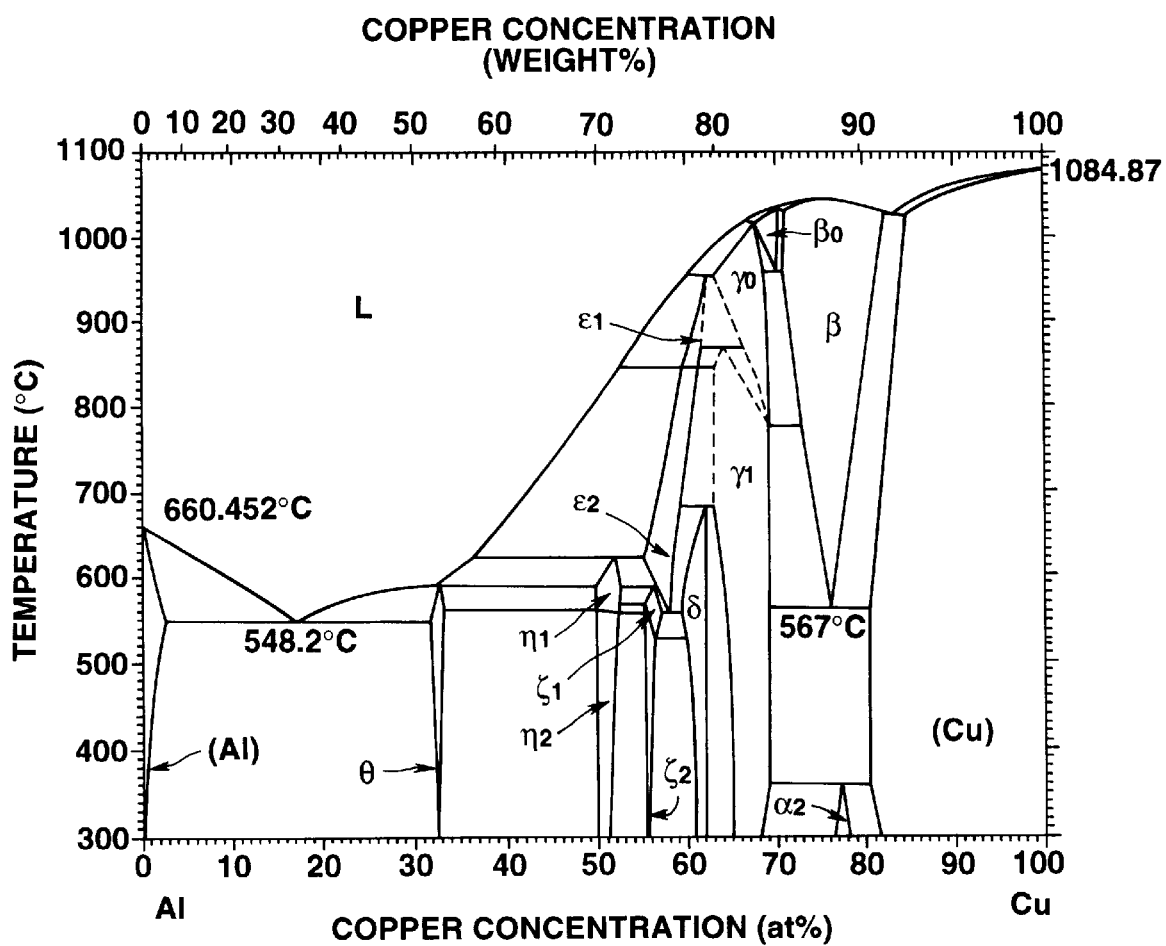
FIG. 13 is a phase diagram of Al—Cu alloys.

Since the refractive index, serving as a parameter for determining the reflectivity, is determined by electronic oscillation, it seems that the reflectivity is greatly influenced by the atomic arrangement binding electrons, i.e., the crystal structure. A study will now be made using a binary alloy phase diagram for Cu—Al alloys shown in FIG. 13.

This phase diagram shows a phase (crystal structure) which appears at a temperature in each composition. There is a possibility of the appearance of a 6 phase when the concentration of Al exceeds 50 atomic percent where the reflectivity greatly changes. Accordingly, it seems that the 0 phase contributes to the decrease in the reflectivity seen in FIG. 12.

Experiment 7/the relationship between the temperature for forming a Cu—Al layer and the reflectivity This experiment differs from the sample 6b in Experiment 6 in that metal layers comprising a Cu—Al alloy were formed by changing the substrate temperature as 100, 120, 140, 160, 200, 300 and 400° C., and the obtained samples are represented by 7a, 7b, 7c, 7d, 7e, 7f and 7g, respectively. The concentration of Al, the deposition rate and the thickness of the film were fixed to 30 atomic percent where a high reflectivity was obtained in Experiment 6, 0.6 nm/sec and 900 nm, respectively.

Figure 14:
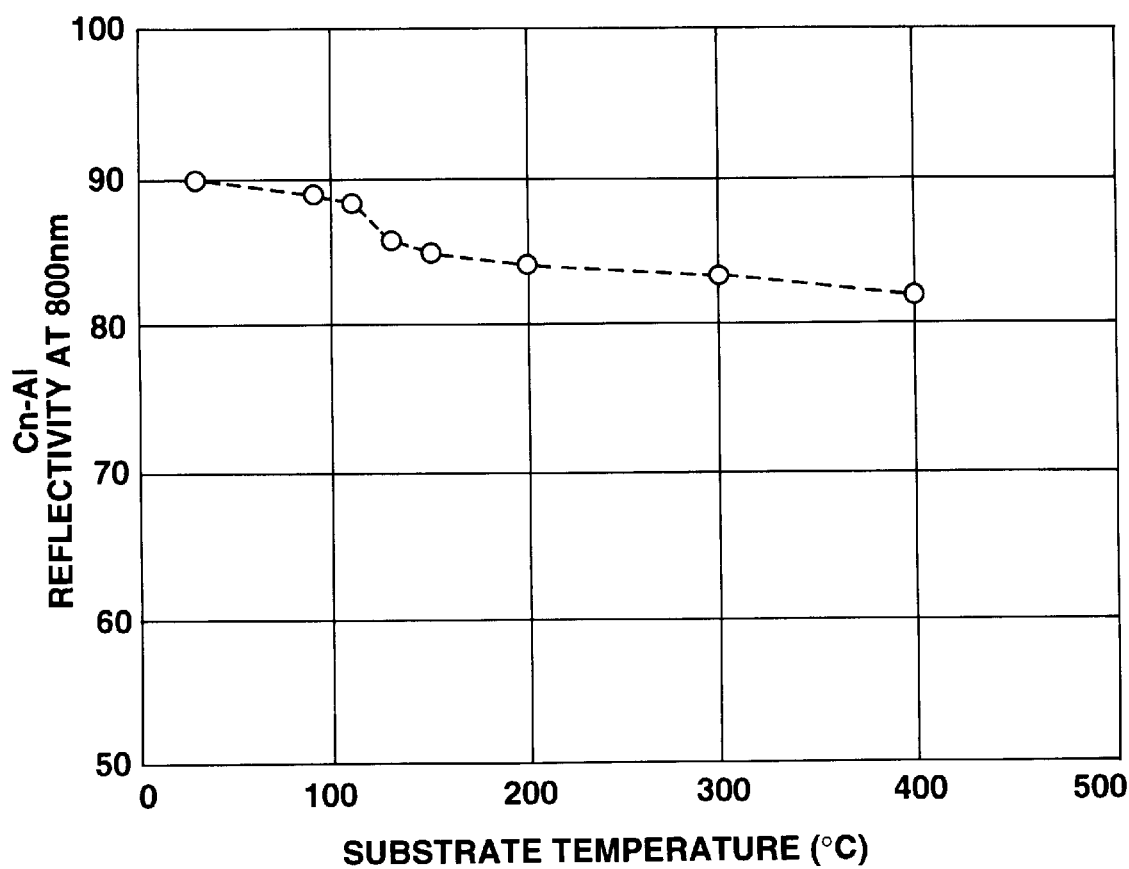
FIG. 14 is a graph illustrating the relationship between the substrate temperature when forming an Al—Cu film and the reflectivity of the obtained film in the present invention.

The same measurements as in Experiment 6 were performed for these samples, and results shown in FIG. 14 were obtained. It can be understood from FIG. 14 that the reflectivity decreases as the substrate temperature increases. Particularly, since the amount of the decrease of the reflectivity increases at a temperature higher than 120° C., it is determined that the film is preferably formed at a temperature equal to or less than 120° C.

As described above, by providing a metal layer having a textured structure, light incident upon a photovoltaic cell can be effectively utilized. In general, in order to deposit a metal layer having a textured structure, a film may be formed at a low deposition rate at a high temperature. However, in the metal layer of the present invention, the reflectivity decreases if a film is formed at a high temperature. Accordingly, in order to provide the metal layer of the present invention with a textured structure, it is necessary to provide a textured structure before depositing the metal layer, and to form the film on that structure at a temperature equal to or less than 120° C.

Experiment 8

This experiment differs from Experiment 6 in that a comb-shaped electrode mask having a spacing of 200 μm was placed on a non-alkali (#7059) substrate having a size of 5 cm square, and a metal layer comprising a Cu—Al alloy was formed on the substrate.

The values of concentration of Al of the prepared samples were 15, 30, 45, 53, 62 and 85 (atomic percent), and the samples are indicated by 8a, 8b, 8c, 8d, 8e and 8f, respectively. For the purpose of comparison, samples 8g and 8h made of pure copper and pure aluminum, respectively, were prepared.

Figure 15:
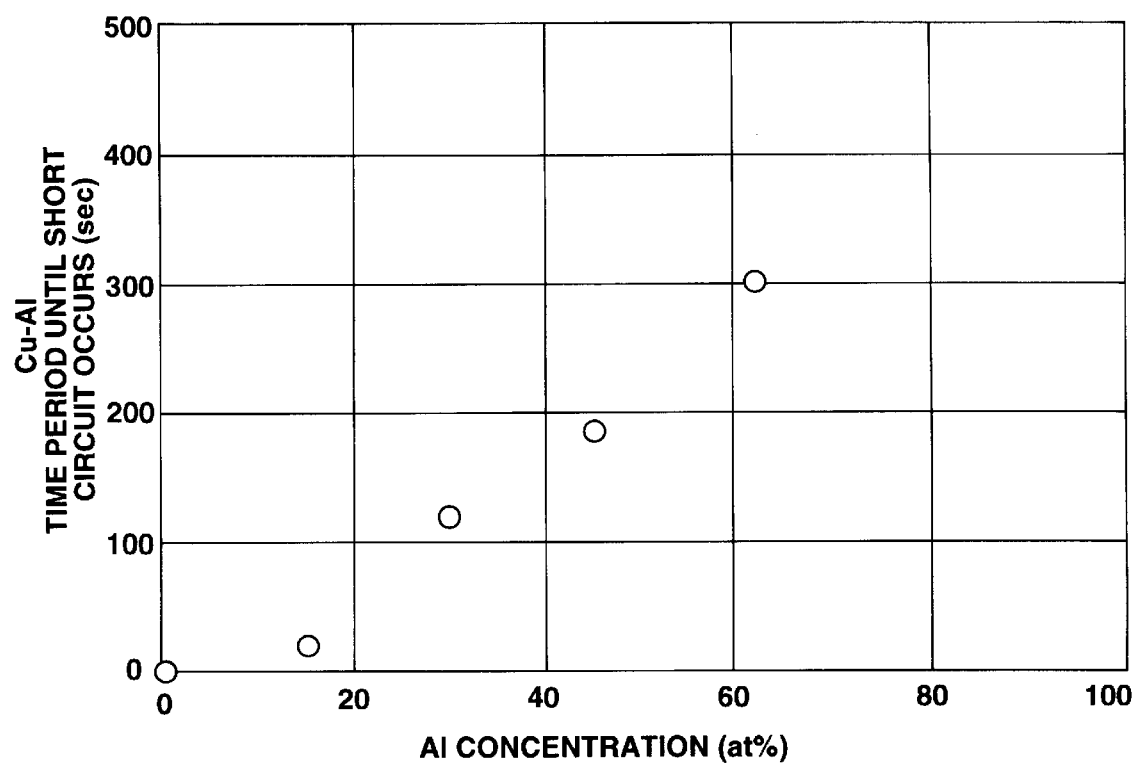
FIG. 15 is a graph illustrating the relationship between the time period until short circuit between electrodes occurs due to the growth of dendrite crytals in each sample and the content of Al in an Al—Cu alloy in the present invention.

A pure-water droplet was placed on the electrodes having the spacing of 200 μm for each of these 8 samples, a voltage of 10 V was applied between the electrodes, and the growth of dendrite crystals was observed under a microscope. FIG. 15 is a graph in which the ordinate represents the time period until the electrodes were short-circuited due to the growth of dendrite crystals, and the abscissa represents the concentration of Al in the Cu—Al alloy. It has become clear from FIG. 15 that the time period until the electodes were short-circuited increases as the amount of addition of Al decreases, and that the frequency of generation of dendrite cystals can be suppressed. Particularly, when the concentration of Al exceeds 70 atomic percent, the generation of dendrite crystals is not observed.

Experiment 9

In this experiment, after forming a ZnO transparent layer on a metal layer comprising a Cu—Al alloy, a power generation layer comprising a nip junction of a thin-film semiconductor, a transparent electrode and a collecting electrode were laminated in this sequence.

Manufacturing procedures will now be described.

(1) The metal layer comprises a Cu—Al alloy having a concentration of Al of 45 atomic percent and a thickness of 100 nm, and was formed in the same manner as in Experiment 6.

(2) A ZnO film 1,000 nm thick, serving as the transparent layer, was deposited on the metal layer.

(3) An n-type a-Si layer 20 nm thick, an i-type a-Si layer 400 nm thick, and a p-type microcrystalline (μc) Si layer 10 nm thick were sequentially deposited on the transparent layer by a glow discharge decomposition method using $SiH_4$ and $PH_3$, $SiH_4$, and $SiH_4$, $BF_3$ and $H_2$ as source gases, respectively, to provide the power generation layer.

(4) An indium-tin oxide (ITO) film 65 nm thick was deposited on the power generation layer by a resistance heating vacuum deposition method to provide the transparent electrode.

(5) The collecting electrode having a width of 300 μm was formed on the transparent electrode using an Ag paste to provide a solar cell.

The sample obtained according to the above-described processes (1)–(5) is represented by 9a.

For the purpose of comparison, samples whose metal layers comprise pure copper and pure aluminum were prepared and are represented by 9b and 9c, respectively.

The values of photocurrent Jsc were measured for these samples under an AM-1.5 solar simulator. While the measured value is 16.5 mA/cm$^2$ for the sample 9c, the measured value for the sample 9a is 17.3 mA/cm$^2$, which is a high value. The value of Jsc could not be measured for the sample 9b, because the resistance (Rsh) between the substrate and the collecting electrode was low and a specified output was not generated.

Experiment 10

In this experiment, a reverse voltage of 0.85 V was applied to the two kinds of samples 9a and 9c obtained in Experiment 9 in an atmosphere of 85% relative humidity and 85° C. (a high-temperature high-humidity reverse-bias test) in a dark state, and changes in time of the value of RshDk (Rsh in a dark state) were measured. Instead of the sample 9b having the metal layer comprising pure copper which could not be obtained in the form of a cell in Experiment 9, a sample 5b having a metal layer comprising pure Ag and having the same migration characteristics was prepared and compared with the other samples.

Figure 16:
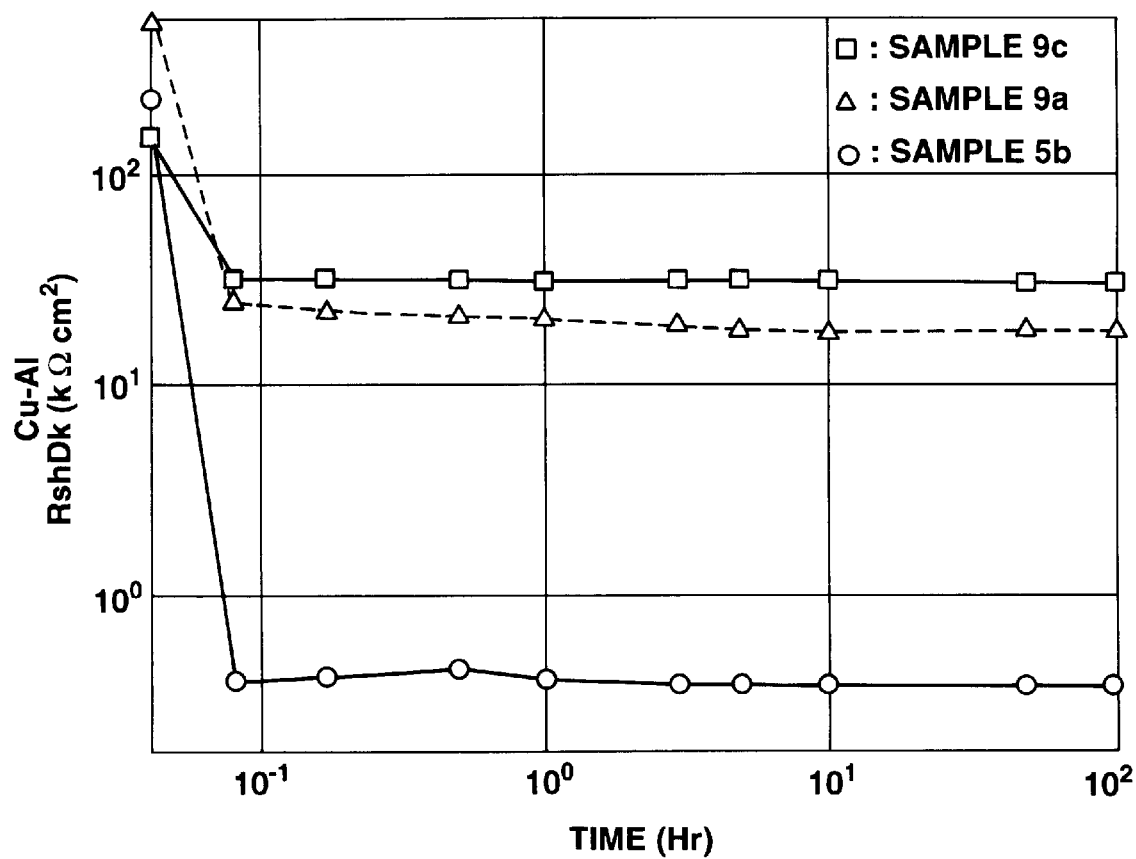
FIG. 16 is a graph illustrating the relationship between the value of RshDk of each Al—Cu film and the elasped time period in the present invention.

FIG. 16 illustrates the results of changes in time of the values of RshDk for the respective samples. The results of preceding experiments indicate that, when the value of RshDk becomes less than 10 kΩ cm$^2$, no open voltage appears under the light of a low illuminance, thereby causing problems in the characteristics and reliability of the solar cell. Accordingly, a condition of RshDk ≧10 kΩ cm$^2$ is set as the acceptability criterion of the high-humidity reverse-bias test.

It has become clear from FIG. 16 that the value of RshDk of the sample 5b rapidly decreases as soon as the measurement starts to become less than 10 kΩ cm$^2$. The value of RshDk of the sample 9c does not become less than 31 kΩ cm$^2$. Although the value of RshDk decreases more than the sample 9c, the degree of the decrease is considerably improved and the value does not become less than 10 k Ω cm$^2$.

From the above-described results of the experiments, it can be understood that a Cu—Al alloy suitable for the reflecting layer preferably has a concentration of Al of 30–50 atomic percent and is formed at a substrate temperature equal to or less than 120° C.

A description will now be provided of other components of the photovoltaic cell of the present invention.

Transparent conductive layer

The transparent conductive layer increases random reflection of incident light and reflected light to increase the length of the optical path within the semiconductor layer. It also prevents the diffusion or migration of elements constituting the metal layer into the semiconductor layer, which causes the shunt of the photovoltaic cell. By having an appropriate resistance, the transparent conductive layer prevents short circuit in the semiconductor layer due to a defect, such as a pinhole or the like. It is desirable that the conductivity of the transparent conductive layer is at least 10$^{-8}$ (1/Ω cm) and less than or equal to 10$^{-1}$ (1/Ω cm).

It is also preferable that the surface of the transparent conductive film has projections and recesses as the metal layer.

The transparent conductive layer is formed by depositing a film of a conductive oxide, such as ZnO, ITO or the like, by vacuum deposition, sputtering, CVD, plating or the like. A substance for changing the conductivity may be added to such a compound. For example, Cu and Al may be added to ZnO and $SnO_2$, respectively.

Semiconductor layer

Amorphous or microcrystalline Si, C, Ge or an alloy made of these materials is used as the material for the semiconductor layer. At the same time, hydrogen and/or halogen atoms are present. The content is preferably 0.1–40 atomic percent. Oxygen, nitrogen or the like may also be present. It is desirable that the concentration of such an impurity is equal to or less than $5 \times 10^{19}$ cm$^{-3}$. A group-III element and a group-V element is to be present for providing a p-type semiconductor and an n-type semiconductor, respectively.

In the case of a stacked cell, it is preferable that the i-type semiconductor layer of the pin junction which is closer to the light-incident side has a wide band gap, and the band gap decreases at a side separated from the light-incident side. It is also preferable that within the i layer, a minimum value of the band gap is present at a position closer to the p layer than the center position of the i layer.

A crystalline semiconductor or a semiconductor having a wide band gap is suitable for the doped layer at the light-incident side.

Method for forming the semiconductor layer

Microwave (MW) plasma CVD or radio-frequency (RF) plasma CVD is suitable for forming the above-described semi-conductor layer. The layer is formed according to the following procedure.

(1) The pressure of a deposition chamber (vacuum chamber) whose pressure can be reduced is reduced to a predetermined initial pressure.

(2) Material gases, such as source gases, a dilution gas and the like, are introduced into the deposition chamber, and the pressure of the deposition chamber is set to a predetermined deposition pressure while evacuating the chamber by a vacuum pump.

(3) The temperature of the substrate is set to a predetermined temperature using a heater.

(4) In MW-CVD, a microwave oscillated by a microwave power supply is guided by a waveguide and is introduced into the deposition chamber via a dielectric window (made of alumina ceramic or the like). When the frequency of the microwave is as low as 100 MHZ–1 GHZ, the microwave may be applied from a metal electrode.

In RF-CVD, a radio wave from a Radio Wave power supply is introduced into the deposition chamber via a discharging electrode.

(5) The plasma of the source gases is generated to decompose the source gases, and a film is deposited on the substrate disposed in the deposition chamber.

In the case of MW-CVD, it is preferable that the substrate temperature within the deposition chamber is 100–450 °C., the internal pressure is 0.5–30 mTorr, the power of the microwave is 0.01–1 W/cm$^3$, the frequency of the microwave is 0.1–10 GHz, and the deposition rate is 0.05–20 nm/sec.

In the case of RF-CVD, it is preferable that the frequency of the radio wave is 0.1–100 MHz, the substrate temperature within the deposition chamber is 100–350° C., the internal pressure is 0.1–10 Torr, the RF power is 0.001–0.5 W/cm$^3$, and the deposition rate is 0.01–3 nm/sec.

Source gases suitable for depositing a group-IV or group-IV-alloy amorphous semiconductor layer which is suitable for the photovoltaic cell of the present invention mainly comprise compounds capable of being gasified containing silicon atoms, such as $SiH_4$, $Si_2H_6$ and the like, and compounds capable of being gasified containing germanium atoms, such as $GeH_4$ and the like.

A compound capable of being gasified containing carbon, nitrogen, oxygen or the like may also be used.

$B_2H_6$, $BF_3$ or the like is used as a dopant gas for providing a p-type layer.

$PH_3$, $PF_3$ or the like is used as a dopant gas for providing an n-type layer.

Particularly when depositing a microcrystalline or polycrystalline semiconductor layer, or a layer of a material having a small absorption or a wide band gap, such as SiC or the like, it is preferable to increase the dilution ratio of source gases by a hydrogen gas, and to introduce a microwave or a radio wave having relatively high power.

Transparent electrode

The transparent electrode can also operate as an antireflection film by appropriately setting its thickness.

The transparent film is formed by depositing a material, such as ITO, ZnO, $InO_3$ or the like, by vacuum deposition, CVD, spraying, spinning-on, immersion or the like. A substance for changing the conductivity may be added to the above-described compound.

Collecting electrode

The collecting electrode is provided for improving the collecting efficiency. The collecting electrode may be provided, for example, by forming a metal film of an electrode pattern by sputtering using a mask, by printing using a conductive paste or a solder paste, or by fixing metal wires by a conductive paste.

Protective layers may be formed on both surfaces of the photovoltaic cell if necessary. A reinforcing member, such as a steel plate or the like, may also be used.

Embodiment 1

A specific example of forming a photovoltaic cell having a metal layer comprising an Al—Ag alloy (the content of silver of 25 atomic percent) will now be described.

(1) A ZnO layer 103 1,000 nm thick was deposited on the sample 1f prepared in Experiment 1 (the metal layer 102, comprising an Al—Ag alloy film (the content of Ag=25 atomic percent), formed on the stainless steel plate (SUS304) 101) at a substrate temperature of 350° C. using a ZnO target to provide a substrate 1001 having the back reflecting layer (transparent layer) 103 formed thereon. The surface of the ZnO layer was made to have a textured structure.

Figure 9:
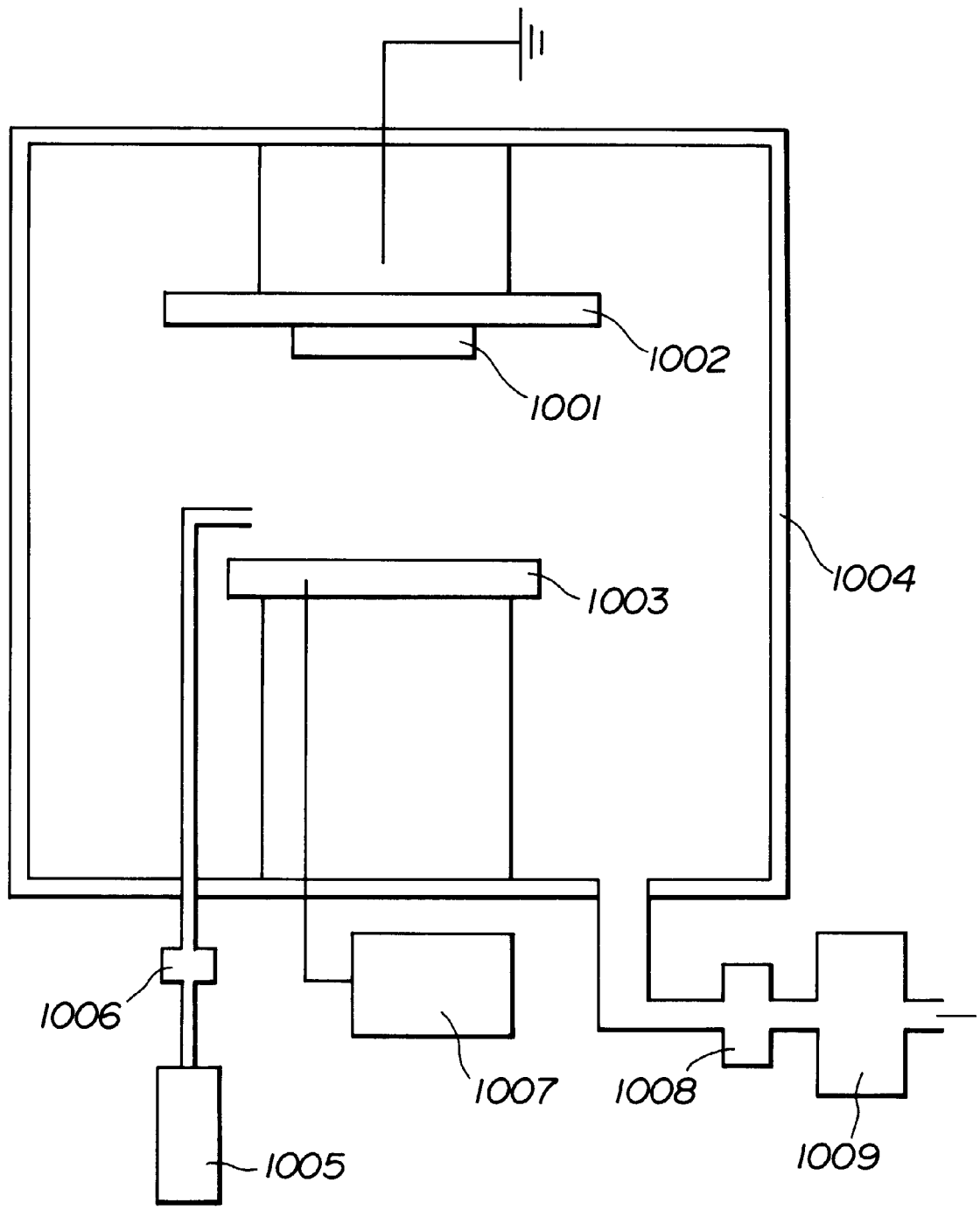
FIG. 9 is a schematic diagram illustrating the configuration of a capacitive-coupling high-frequency CVD (chemical vapor deposition) apparatus used in the present invention.

(2) A semiconductor layer 104 providing a thin-film semiconductor junction was formed on the substrate 1001 formed by the above-described process (1) using the commercially available capacitive-coupling RF CVD apparatus (CHJ-3030 made by Ulvac Corporation) shown in FIG. 9.

(2-1) The substrate 1001 was set on an anode 1002. After being roughly evacuated by a vacuum pump 1009 via an exhaust tube 1008, the inside of a reaction chamber 1004 was evacuated to a high vacuum. At that time, the surface temperature of the substrate 1001 was controlled to 350° C. by a temperature control mechanism (not shown).

(2-2) When the inside of the reaction chamber 1004 was sufficiently evacuated, 300 sccm (standard cubic centimeters per minute) of $SiH_4$, 4 sccm of $SiF_4$, 55 sccm of $PH_3/HZ$ (diluted to 1% by $H_2$) and 40 sccm of $H_2$ were introduced into the reaction chamber 1004 from a gas supply source 1005 via a gas introducing tube 1006. By adjusting the aperture of a slottle valve 1008, the internal pressure within the reaction chamber 1004 was maintained at 1 Torr. As soon as the internal pressure was stabilized, electric power of 200 W was supplied from a RF power supply. By maintaining a plasma for 5 minutes, an n-type a-Si layer 105 was formed on the transparent layer 103.

(2-3) After again evacuating the inside of the reaction chamber 1004, 300 sccm of $SiH_4$, 4 sccm of $SiF_4$ and 40 sccm of $H_2$ were introduced into the reaction chamber 1004 from the gas supply source 1005 via the gas introducing tube 1006. By adjusting the aperture of the slottle valve 1008, the internal pressure within the reaction chamber 1004 was maintained at 1 Torr. As soon as the internal pressure was stabilized, electric power of 150 W was supplied from the RF power supply. By maintaining a plasma for 60 minutes, an i-type a-Si layer 106 was formed on the n-type a-Si layer 105.

(2-4) After again evacuating the inside of the reaction chamber 1004, 50 sccm of $SiH_4$, 50 sccm of $BF_3/H_2$ (diluted to 1% by $H_2$) and 500 sccm of $H_2$ were introduced into the reaction chamber 1004 from the gas supply source 1005 via the gas introducing tube 1006. By adjusting the aperture of the slottle valve 1008, the internal pressure within the reaction chamber 1004 was maintained at 1 Torr. As soon as the internal pressure was stabilized, electric power of 300 W was supplied from the RF power supply. By maintaining a plasma for 2 minutes, a p-type μc-Si layer 107 was formed on the i-type a-Si layer 106.

(3) After depositing ITO on the sample of the above-described process (2), having the semiconductor layer 104 formed on the substrate 1001, using a resistance heating vacuum deposition apparatus (not shown), a paste containing an aqueous solution of iron chloride was printed to provide a desired transparent electrode 108.

(4) A collecting electrode 109 was formed on the sample of the above-described process (3) having the transparent electrode 108 formed on the semiconductor layer 104 by performing screen printing of an Ag paste to provide a thin-film-semiconductor solar cell.

Ten thin-film-semiconductor solar cells were manufactured according to the above-described processes (1)–(4), and the values of Jsc of the obtained cells were measured under the light of AM-1.5.

The results of the measurement indicate that the solar cells of the present invention have a current higher by 6.1 % in average than separately manufactured solar cells having a metal layer comprising pure Al.

The values of RshDk did not decrease in a high-humidity reserve-bias test performed for the 10 solar cells of this embodiment.

Embodiment 2

Figure 10:
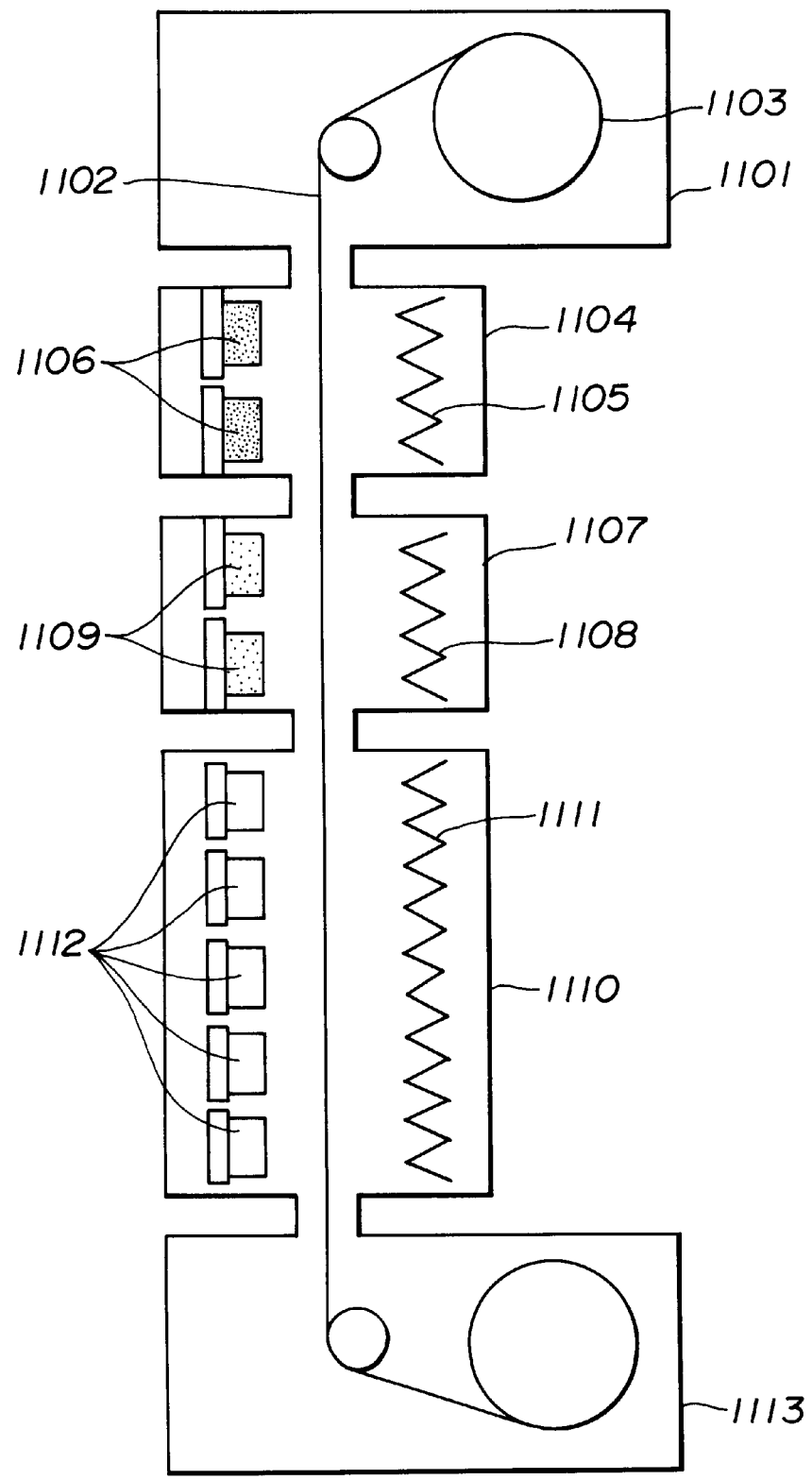
FIG. 10 is a schematic diagram illustrating the configuration of an apparatus for continuously forming a back reflecting layer in the present invention.
Figure 11:
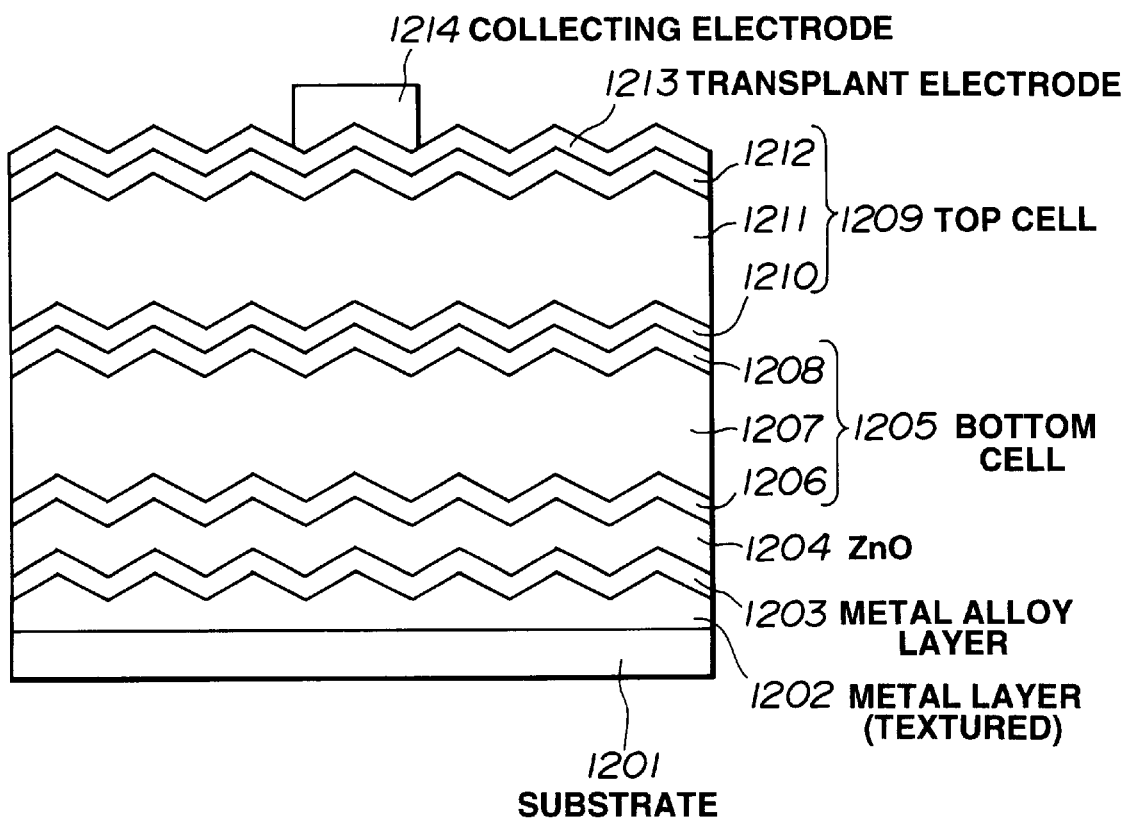
FIG. 11 is a cross-sectional view illustrating the configuration of a tandem solar cell according to the present invention.

In this embodiment, an Ag—Al back reflecting layer was continuously formed using the apparatus shown in FIG. 10, and tandem solar cells, in which the semiconductor layers shown in FIG. 11 are nip-type layers, and the i-type semiconductor layer comprises a-Si/a-SiGe, were manufactured. A stainless steel belt-like substrate 1102 was used as the substrate.

Manufacturing procedures will now be described.

(1) A roll 1103 of a belt-like substrate 1102 (having a width of 350 mm, a thickness of 0.2 mm and a length of 500 m) which had been washed was set in a substrate feeding chamber 1101. The belt-like substrate 1102 was fed from the substrate feeding chamber 1101 to a substrate rolling chamber 1113 via metal-layer deposition chambers 1104 and 1107, and a transparent-layer deposition chamber 1111. The belt-like substrate 1102 was heated to desired temperatures in the respective deposition chambers by substrate heaters 1105, 1108 and 1110.

(2) An Al layer 1202 having a textured structure was deposited on the belt-like substrate 1102 maintained at 400° C. in the deposition chamber 1104, where an Al target 1006 having a purity of 99.99% was disposed, by magnetron sputtering.

(3) An Al—Ag alloy layer 1203 200 nm thick was deposited on the Al layer 1202 without raising the temperature of the substrate in the deposition chamber 1107, where an Al—Ag alloy target 1109 having a purity of 99.99% was disposed, by DC magnetron sputtering.

(4) A ZnO layer 1204 1,000 nm thick was deposited on the Al—Ag alloy layer 1203 in the deposition chamber 1110, where a ZnO target 1112 having a purity of 99.99% was deposited, by DC magnetron sputtering.

(5) Semiconductor layers 1205 and 1209 comprising thin-film semiconductors shown in FIG. 11 were formed on the ZnO layer 1204. The layer 1205 is a bottom cell, and the layer 1209 is a top cell. Layers 1206 and 1210 are n-type a-Si layers, layers 1208 and 1212 are p-type Fc-Si layers, a layer 1207 is an i-type SiGe layer, and a layer 1211 is an i-type a-Si layer.

These semiconductor layers 1205 and 1209 comprising thin-film semiconductors were continuously manufactured using a roll-to-roll film forming apparatus as described in U.S. Pat. No. 4,492,181.

(6) A transparent electrode 1213 was formed on the semiconductor layer 1209 using a sputtering apparatus which is similar to the apparatus shown in FIG. 10.

(7) A collecting electrode 1214 was formed on the transparent electrode 1213.

(8) After performing patterning of the transparent electrode 1213 and forming the collecting electrode 1214, the belt-like substrate 1202 was cut.

By using the above-described continuous thin-film forming apparatus, a mass-production effect can be obtained.

Ten thin-film-semiconductor solar cells were manufactured according to the above-described processes (1)–(8), and the values of Jsc of the obtained cells were measured under the light of AM-1.5.

The results of the measurements indicate that the solar cells of the present invention have a current higher by 5.9 % in average than separately manufactured solar cells having a metal layer comprising pure Al.

The values of RshDk did not decrease in a high-humidity reserve-bias test performed for the 10 solar cells of this embodiment.

Embodiment 3

This embodiment differs from Embodiment 2 in that using a stainless steel belt-like substrate whose surface was subjected to texture processing as the substrate, triple solar cells in which semiconductor layers comprise nip-type layers, and the i-type semiconductor layer comprises a-Si/a-SiGe/a-Se were manufactured. Furthermore, a metal layer comprising Al was not formed in the deposition chamber 1104.

A metal layer comprising an Al—Ag alloy and a transparent layer were deposited using the apparatus shown in FIG. 10. Then, solar cells were manufactured under conditions of film formation shown in Table 1 using the roll-to-roll apparatus shown in FIG. 12.

TABLE 1

Supporting member: stainless steel SUS430 (JIS (Japanese Industrial Standards)) 0.125 mm thick
Substrate: SUS430/Al—Ag 7 atomic % alloy 450 nm thick/ZnO 1 μm thick (textured structure)

| | |
|---|---|
| Bottom cell | |
| n-type layer | $SiH_4$: 10 sccm, $H_2$: 480 sccm, |
| | $PH_3$ (diluted to 1% by $H_2$): 5 sccm |
| | Pressure: 1.3 Torr, RF power: 18 W |
| | Substrate temperature: 380° C., Thickness: 40 nm |
| RF-i layer | $SiH_4$: 80 sccm, $H_2$: 500 sccm |
| | Pressure: 0.5 Torr, RF power: 20 W |
| | Substrate temperature: 270° C., Thickness: 10 nm |
| MW-i layer | $SiH_4$: 160 sccm, $GeH_4$: 160 sccm, $SiH_2I_2$: 8 sccm, |
| | $H_2$: 600 sccm, $B_2H_6$: 2.4 ppm |
| | Pressure: 7 mTorr, MW power: 440 W, RF bias power: 1,000 W, Substrate temperature: 380° C. |
| | Thickness: 70 nm |
| RF-i layer | $SiH_4$: 80 sccm, $H_2$: 500 sccm |
| | Pressure: 0.5 Torr, RF power: 20 W |
| | Substrate temperature: 270° C., Thickness: 20 nm |
| p-type layer | $SiH_4$ (diluted to 10% by $H_2$): 2.5 sccm, |
| | $H_2$: 340 sccm, $BF_3$ (diluted to 2% by $H_2$): 20 sccm |
| | Pressure: 2 Torr, RF power: 420 W, |
| | Substrate temperature: 200° C. |
| Middle cell | |
| n-type layer | $SiH_4$: 10 sccm, $H_2$: 480 sccm |
| | $PH_3$ (diluted to 1% by $H_2$): 10 sccm |
| | Pressure: 1.3 Torr, RF power: 18 W |
| | Substrate temperature: 380° C., Thickness: 40 nm |
| RF-i layer | $SiH_4$: 80 sccm, $H_2$: 500 sccm |
| | Pressure: 0.5 Torr, RF power: 20 W |
| | Substrate temperature: 270° C., Thickness: 10 nm |
| MW-i layer | $SiH_4$: 160 sccm, $GeH_4$: 160 sccm, $SiH_2Cl_2$: 8 sccm, |
| | $H_2$: 600 sccm, $B_2H_6$: 4 ppm |
| | Pressure: 7 mTorr, MW power: 440 W, RF bias power: 1,000 W, Substrate temperature: 380° C. |
| | Thickness: 50 nm |
| RF-i layer | $SiH_4$: 80 sccm, $H_2$: 500 sccm |
| | Pressure: 0.5 Torr, RF power: 20 W |
| | Substrate temperature: 270° C., Thickness: 20 nm |

TABLE 1-continued

Supporting member: stainless steel SUS430 (JIS (Japanese Industrial Standards)) 0.125 mm thick
Substrate: SUS430/Al—Ag 7 atomic % alloy 450 nm thick/ZnO 1 μm thick (textured structure)

| | |
|---|---|
| p-type layer | $SiH_4$ (diluted to 10% by $H_2$): 2.5 sccm, $H_2$: 340 sccm, $BF_3$ (diluted to 2% by $H_2$): 20 sccm<br>Pressure: 2 Torr, RF power: 420 W,<br>Substrate temperature: 200° C. |
| Top cell | |
| n-type layer | $SiH_4$: 1 sccm, $H_2$: 48 sccm<br>$PH_3$ (diluted to 1% by $H_2$): 1 sccm<br>Pressure: 1.3 Torr, RF power: 18 W<br>Substrate temperature: 380° C., Thickness: 10 nm |
| RF-i layer | $SiH_4$: 40 sccm, $H_2$: 500 sccm<br>Pressure: 0.5 Torr, RF power: 20 W<br>Substrate temperature: 250° C., Thickness: 100 nm |
| p-type layer | $SiH_4$ (diluted to 10% by $H_2$): 2.5 sccm, $H_2$: 340 sccm, $BF_3$ (diluted to 2% by $H_2$): 20 sccm<br>Pressure: 2 Torr, RF power: 420 W,<br>Substrate temperature: 200° C. |
| Transparent electrode | $In_2O_3$ formed by reactive vacuum deposition<br>70 nm thick |
| Collecting electrode | Ag paste |

Manufacturing procedures will now be described in detail with reference to Table 1.

(1) A belt-like substrate (35 cm wide) 5401 was set in a loading chamber 5010 for introducing a belt-like substrate. The belt-like substrate 5401 was connected to a sheet winding jig 5402 provided in an unloading chamber 5150 via all deposition chambers and all gas gates.

(2) The respective deposition chambers were evacuated to a pressure equal to or less than $10^{-3}$ Torr using an evacuating apparatus (not shown).

(3) A hydrogen gas was supplied from mixing devices for forming deposited films 5024, 5034, 5044, 5054, 5064, 5074, 5084, 5094, 5104, 5114, 5124, 5134 and 5144 to the respective deposition chambers.

(4) A hydrogen gas was supplied from respective gate gas supply devices to respective gas gates 5201, 5202, 5203, 5204, 5205, 5206, 5207, 5208, 5209, 5210, 5211, 5212, 5213 and 5214. In the present embodiment, since the distance between the belt-like substrate and the gas gates were set to 1 mm, the hydrogen gas was flown at a rate of 1,000 sccm.

(5) The belt-like substrate 5401 was heated to a predetermined temperature shown in Table 1 using a heater for heating the substrate of each deposition device.

(6) After the substrate temperature was stabilized, the hydrogen gas supplied to each deposition chamber was switched to predetermined source gases used for deposition in the deposition chamber shown in Table 1.

(7) After switching the hydrogen gas to the source gases, the pressure of each deposition chamber was adjusted to the value shown in Table 1 by adjusting the aperture of the discharge valve of each discharge device.

(8) Upon completion of process (7), the conveyance of the belt-like substrate 5401 was started. After the pressure was stabilized, the RF power or the MW power for generating a plasma shown in Table 1 was supplied to each deposition chamber.

Ten thin-film-semiconductor solar cells were manufactured according to the above-described processes (1)–(8), and the values of Jsc of the obtained cells were measured under the light of AM-1.5.

The results of the measurements indicate that the solar cells of the present invention have a current higher by 6.3% in average than separately manufactured solar cells having a metal layer comprising pure Al.

The values of RshDk did not decrease in a high-humidity reserve-bias test performed for the solar cells of this embodiment.

Embodiment 4

A specific example of forming a photovoltaic cell having a metal layer comprising an Al—Cu alloy (the content of Al of 50 atomic percent) will now be described.

A description will be provided of manufacturing procedures.

(1) A ZnO layer 103 1,000 nm thick was deposited on the sample 1d prepared in Experiment 6 (the metal layer 102, comprising a Cu—Al alloy film (the concentration of Al=50 atomic percent), formed on the stainless steel plate (SUS304) 101) at a substrate temperature of 350° C. using a ZnO target to provide a substrate 1001 having the back reflecting layer (transparent layer) 103 formed thereon. The surface of the ZnO layer was made to have a textured structure.

Thin-film-semiconductor solar cells were completed in the same manner as the process (2) and the succeeding processes of Embodiment (1). Ten thin-film-semiconductor solar cells were manufactured according to the above-described processes (1)–(4), and the values of Jsc of the obtained cells were measured under the light of AM-1.5.

The results of the measurements indicate that the solar cells of the present invention have a current higher by 6% in average than separately manufactured solar cells having a metal layer comprising pure Al.

Although the values of RshDk decreased in time in a high-humidity reserve-bias test performed for the 10 solar cells of this embodiment, the values did not become less than 10 kΩ $cm^2$.

Embodiment 5

In this embodiment, using the apparatus shown in FIG. 10, tandem solar cells, in which the power generation layers shown in FIG. 1 are nip-type layers, and the i-type semiconductor layer comprises a-Si/a-SiGe, were manufactured. A stainless steel belt-like substrate 1102 was used as the substrate.

Manufacturing procedures will now be described. (1) A roll 1103 of the belt-like substrate 1102 (having a width of 350 mm, a thickness of 0.2 mm and a length of 500 m) which had been washed was set in the substrate feeding chamber 1101. The belt-like substrate 1102 was fed from the substrate feeding chamber 1103 to the substrate rolling chamber 1113 via the metal-layer deposition chambers 1104 and 1107, and the transparent-layer deposition chamber 1111. The belt-like substrate 1102 was heated to desired temperatures in the respective deposition chambers by the substrate heaters 1105, 1108 and 1110.

(2) An Al layer 1202 having a textured structure was deposited on the belt-like substrate 1102 maintained at 400° C. in the deposition chamber 1104, where an Al target 1006 having a purity of 99.99% was disposed, by magnetron sputtering.

(3) A Cu—Al alloy layer 1203 100 nm thick was deposited on the Al layer 1202 without raising the temperature of the substrate in the deposition chamber 1107, where a Cu—Al alloy target 1109 having a purity of 99.99% was disposed, by DC magnetron sputtering.

(4) A ZnO layer 1204 1,000 nm thick was deposited on the Cu—Al alloy layer 1203 in the deposition chamber 1110, where a ZnO target 1112 having a purity of 99.99% was disposed, by DC magnetron sputtering.

Ten thin-film-semiconductor solar cells were manufactured in the same manner as in Embodiment 2, and the values of Jsc of the obtained cells were measured under the light of AM-1.5.

The results of the measurements indicate that the solar cells of the present invention have a current higher by 5.4 % in average than separately manufactured solar cells having a metal layer comprising pure Al.

Although the values of RshDk decreased in a high-humidity reserve-bias test performed for the 10 solar cells of this embodiment, the values did not become less than 10 kΩ cm$^2$.

Embodiment 6

This embodiment differs from Embodiment 5 in that using a stainless steel belt-like substrate whose surface was subjected to texture processing as the substrate, triple solar cells in which power generation layers comprise nip-type layers, and the i-type semiconductor layer comprises a-Si/a-SiGe/a-Se were manufactured. Furthermore, a metal layer comprising Al was not formed in the deposition chamber 1104.

A metal layer comrising a Cu—Al alloy and a transparent layer were deposited using the apparatus shown in FIG. 10. Ten thin-film-semiconductor solar cells were manufactured under conditions of film formation shown in Table 2 using the roll-to-roll apparatus shown in FIG. 10, and the values of Jsc of the obtained cells were measured under the light of AM-1.5.

The results of the measurements indicate that the solar cells of the present invention have a current higher by 5.7 % in average than separately manufactured solar cells having a metal layer comprising pure Al.

Although the values of RshDk decreased in a high-humidity reserve-bias test performed for the 10 solar cells of this embodiment, the values did not become less than 10 kΩ cm$^2$.

TABLE 2

Supporting member: stainless steel SUS430 (JIS (Japanese Industrial Standards)) 0.125 mm thick
Substrate: SUS430/Ag 450 nm thick/ZnO 1 μm thick (texture structure)

Bottom cell

| | |
|---|---|
| n-type layer | SiH$_4$: 10 sccm, H$_2$: 480 sccm, PH$_3$ (diluted to 1% by H$_2$): 5 sccm Pressure: 1.3 Torr, HF power: 18 W Substrate temperature: 386° C., Thickness: 40 nm |
| RF-i layer | SiH$_4$: 80 sccm, H$_2$: 500 sccm Pressure: 0.5 Torr, RF power: 20 W Substrate temperature: 270° C., Thickness: 10 nm |
| MW-i layer | SiH$_4$: 160 sccm, GeH$_4$: 160 sccm, SiH$_2$Cl$_2$: 8 sccm, H$_2$: 600 sccm, B$_2$H$_6$: 2.4 ppm Pressure: 7 mTorr, MW power: 440 W, RF bias power: 1,000 W, Substrate temperature: 380° C. Thickness: 70 nm |
| RF-i layer | SiH$_4$: 80 sccm, H$_2$: 500 sccm Pressure: 0.5 Torr, RF power: 20 W Substrate temperature: 270° C, Thickness: 20 nm |
| p-type layer | SiH$_4$ (diluted to 10% by H$_2$): 2.5 sccm, H$_2$: 340 sccm, BF$_3$ (diluted to 2% by H$_2$): 20 sccm Pressure: 2 Torr, RF power: 420 W, Substrate temperature: 200° C. |

Middle cell

| | |
|---|---|
| n-type layer | SiH$_4$: 10 sccm, H$_2$: 480 sccm PH$_3$ (diluted to 1% by H$_2$): 10 sccm Pressure: 1.3 Torr, RF power: 18 W Substrate temperature: 380° C., Thickness: 40 nm |
| RF-i layer | SiH$_4$: 80 sccm, H$_2$: 500 sccm Pressure: 0.5 Torr, RF power: 20 W Substrate temperature: 270° C., Thickness: 10 nm |

TABLE 2-continued

Supporting member: stainless steel SUS430 (JIS (Japanese Industrial Standards)) 0.125 mm thick
Substrate: SUS430/Ag 450 nm thick/ZnO 1 μm thick (texture structure)

| | |
|---|---|
| MW-i layer | SiH$_4$: 160 sccm, GeH$_4$: 160 sccm, SiH$_2$Cl$_2$: 8 sccm, H$_2$: 600 sccm, B$_2$H$_6$: 4 ppm Pressure: 7 mTorr, MW power: 440 W, RF bias power: 1,000 W, Substrate temperature: 380° C. Thickness: 50 nm |
| RF-i layer | SiH$_4$: 80 sccm, H$_2$: 500 sccm Pressure: 0.5 Torr, RF power: 20 W Substrate temperature: 270° C., Thickness: 20 nm |
| p-type layer | SiH$_4$ (diluted to 10% by H$_2$): 2.5 sccm, H$_2$: 340 sccm, BF$_3$ (diluted to 2% by H$_2$): 20 sccm Pressure: 2 Torr, RF power: 420 W, Substrate temperature: 200° C. |

Top cell

| | |
|---|---|
| n-type layer | SiH$_4$: 1 sccm, H$_2$: 48 sccm PH$_3$ (diluted to 1% by H$_2$): 1 sccm Pressure: 1.3 Torr, RF power: 18 W Substrate temperature: 380° C., Thickness: 10 nm |
| RF-i layer | SiH$_4$: 40 sccm, H$_2$: 500 sccm Pressure: 0.5 Torr, RF power: 20 W Substrate temperature: 250° C., Thickness: 100 nm |
| p-type layer | SiH$_4$ (diluted to 10% by H$_2$): 2.5 sccm, H$_2$: 340 sccm, BF$_3$ (diluted to 2% by H$_2$): 20 sccm Pressure: 2 Torr, RF power: 420 W, Substrate temperature: 200° C. |
| Transparent electrode | In$_2$O$_3$ formed by reactive vacuum deposition 70 nm thick |
| Collecting electrode | Ag paste |

What is claimed is:

1. A photovoltaic cell comprising:

a substrate having a textured structure;

a metal layer comprising a silver-aluminum alloy having a reflectivity of at least 86% for light having wavelengths of 600–1000 nm on the substrate and a photovoltaic conversion layer on the metal layer.

2. The photovoltaic cell according to claim 1, wherein the textured structure is formed on the surface of the substrate.

3. The photovoltaic cell according to claim 1, wherein the textured structure is formed on the surface of another metal layer.

4. A method for manufacturing a photovoltaic cell, comprising the steps of:

forming a metal layer comprising a silver-aluminum alloy having a content of silver equal to or less than 30 atomic percent on a substrate having a textured structure by sputtering at a temperature equal to or less than 110° C.; and forming a photovoltaic conversion layer on said metal layer.

5. The method for manufacturing a photovoltaic cell according to claim 4, wherein the textured structure is formed on the surface of the substrate.

6. The method for manufacturing a photovoltaic cell according to claim 4, wherein the textured structure is formed on the surface of another metal layer.

* * * * *

UNITED STATES PATENT AND TRADEMARK OFFICE
CERTIFICATE OF CORRECTION

PATENT NO. : 5,986,204
DATED : November 16, 1999
INVENTOR(S) : YUKIKO IWASAKI ET AL.

Page 1 of 3

It is certified that error appears in the above-identified patent and that said Letters Patent is hereby corrected as shown below:

COLUMN 1

Line 9, "Art p U.S." should read --Art ¶U.S.-- ,

COLUMN 2

Line 2, "(Pd),indium" should read (Pd), indium--;
Line 46, "property" should be deleted;
Line 62, "110 °C.," should read --110 °C.--.

COLUMN 3

Line 9, "120 °C.," should read --120 °C.--;
Line 47, "elasped" should read --elapsed--.

COLUMN 4

Line 3, "cryals" should read --crystals--;
Line 7, "elapsed" should read --elapsed--.

COLUMN 5

Line 17, "X-ray" should read --x-ray--;
Line 18, "X-ray" should read --x-ray--;
Line 21, "result" should read --results--.

COLUMN 6

Line 35, "electodes" should read --electrodes--.

UNITED STATES PATENT AND TRADEMARK OFFICE
CERTIFICATE OF CORRECTION

PATENT NO. : 5,986,204
DATED : November 16, 1999
INVENTOR(S) : YUKIKO IWASAKI ET AL.

It is certified that error appears in the above-identified patent and that said Letters Patent is hereby corrected as shown below:

COLUMN 7

Line 61, "at the room" should read --at room--.

COLUMN 8

Line 3, "X-ray" should read --x-ray--;
Line 5, "8" should read --eight--;
Line 26, "the O" should read --the θ--.

COLUMN 9

Line 6, "8" should read --eight--;
Line 15, "cystals" should read --crystals--.

COLUMN 13

Line 8, "film-semiconductor" should read --film semiconductor--;
Line 9, "film-semiconductor" should read --film semiconductor--;
Line 53, "Fc-Si" should read --$\mu$c-Si--.

COLUMN 14

Line 25, "were" should read --was--;
Table (1), "$SiH_2I_2$:" should read --$SiH_2Cl_2$:--.

COLUMN 15

Line 44, "were set" should read --was set--.

UNITED STATES PATENT AND TRADEMARK OFFICE
CERTIFICATE OF CORRECTION

PATENT NO. : 5,986,204
DATED : November 16, 1999
INVENTOR(S) : YUKIKO IWASAKI ET AL.

It is certified that error appears in the above-identified patent and that said Letters Patent is hereby corrected as shown below:

COLUMN 16

> Line 20, "film-semiconductor" should read
> --film semiconductor--;
> Line 41, "described. (1)" should read --described
> ¶(1)--;
> Line 66, "film-semiconductor" should read
> --film semiconductor--.

COLUMN 17

> Line 21, "film-semiconductor" should read
> --film semiconductor--;
> Table 2, "Hf power" should read ----;
> Table 2, "386 °C ," should read --380 °C,--.

Signed and Sealed this

Seventeenth Day of April, 2001

Attest:

NICHOLAS P. GODICI

Attesting Officer    Acting Director of the United States Patent and Trademark Office